(12) United States Patent
He

(10) Patent No.: US 11,842,579 B2
(45) Date of Patent: Dec. 12, 2023

(54) SYSTEMS AND METHODS TO DIAGNOSE VEHICLES BASED ON THE VOLTAGE OF AUTOMOTIVE BATTERIES

(71) Applicant: The Regents of the University of Colorado, a body corporate, Denver, CO (US)

(72) Inventor: Liang He, Lakewood, CO (US)

(73) Assignee: The Regents of the University of Colorado, a body corporate, Denver, CO (US)

(*) Notice: Subject to any disclaimer, the term of this patent is extended or adjusted under 35 U.S.C. 154(b) by 753 days.

(21) Appl. No.: 16/723,398

(22) Filed: Dec. 20, 2019

(65) Prior Publication Data
US 2020/0202643 A1 Jun. 25, 2020

Related U.S. Application Data

(60) Provisional application No. 62/782,929, filed on Dec. 20, 2018.

(51) Int. Cl.
| | |
|---|---|
| *G07C 5/08* | (2006.01) |
| *G01R 31/367* | (2019.01) |
| *G01R 31/3835* | (2019.01) |
| *G01R 31/00* | (2006.01) |
| *G08B 21/18* | (2006.01) |
| *G06N 5/04* | (2023.01) |
| *G06N 20/00* | (2019.01) |

(52) U.S. Cl.
CPC ......... *G07C 5/0808* (2013.01); *G01R 31/007* (2013.01); *G01R 31/367* (2019.01); *G01R 31/3835* (2019.01); *G06N 5/04* (2013.01); *G06N 20/00* (2019.01); *G07C 5/0816* (2013.01); *G08B 21/18* (2013.01)

(58) Field of Classification Search
None
See application file for complete search history.

(56) References Cited

U.S. PATENT DOCUMENTS

| | | | |
|---|---|---|---|
| 6,738,697 B2 | 5/2004 | Breed | |
| 7,103,460 B1 | 9/2006 | Breed | |
| 8,301,406 B2 * | 10/2012 | Lee | G06K 9/6256 702/77 |
| 10,204,461 B2 * | 2/2019 | Chen | G05B 23/0221 |
| 10,564,222 B2 * | 2/2020 | Pajovic | G01R 31/367 |
| 11,282,304 B2 * | 3/2022 | Kyes | B60W 50/0205 |

* cited by examiner

*Primary Examiner* — Todd Melton

(57) ABSTRACT

Systems and methods for battery-based vehicle diagnostics are provided. Various embodiments include a battery-based diagnostics system that guards vehicles against anomalies with a cyber-physical approach. The diagnostics system can be implemented as an add-on module of commodity vehicles attached to automotive batteries, thus providing vehicles an additional layer of protection. The automotive battery can operate in strong dependency with many physical components of the vehicle, which is observable as correlations between battery voltage and the vehicle's corresponding operational parameters, e.g., a faster revolutions-per-minute (RPM) of the engine, in general, leads to a higher battery voltage. These embodiments exploit such physically induced correlations to diagnose vehicles by cross-validating the vehicle information with battery voltage and may be based on a set of data-driven norm models constructed online.

20 Claims, 40 Drawing Sheets

Figure 1 — Prior Art

SYSTEMS AND METHODS TO DIAGNOSE VEHICLES BASED ON THE VOLTAGE OF AUTOMOTIVE BATTERIES

CROSS-REFERENCE TO RELATED APPLICATIONS

This application claims priority to U.S. Provisional Application Ser. No. 62/782,929 filed Dec. 20, 2018 which is incorporated herein by reference in its entirety for all purposes.

STATEMENT REGARDING FEDERALLY SPONSORED RESEARCH

This invention was made with government support under grant number CNS1739577 awarded by the National Science Foundation. The government has certain rights in the invention.

TECHNICAL FIELD

Various embodiments of the present technology generally relate to vehicle diagnostics. More specifically, some embodiments of the present technology relate to systems and methods to diagnose vehicles based on the voltage of automotive batteries.

BACKGROUND

The automotive industry is increasingly employing software-based solutions to provide value-added features for vehicles such as automatic crash responses and remote diagnostics. Software-based solutions are becoming of even greater importance with the advent of electric vehicles and autonomous driving. The ever-increasing number of electronic components in vehicles (e.g. computation systems, communication systems, and/or control systems), although useful, create new risks and problems as demonstrated by the millions of vehicles recalled by a variety of different vehicle manufactures over the recent years.

There are a number of challenges and inefficiencies created in traditional software-based vehicle communication, computation, and control systems. For example, traditional vehicle software systems are often unable to handle and manage the ever-growing data volume that exists in modern automobiles. Additionally, traditional vehicle software systems are susceptible to getting hacked and are unable to identify when one or more vehicle systems have been comprised. Thus, it can be difficult to maintain vehicle operational integrity. It is with respect to these and other problems that embodiments of the present invention have been made.

SUMMARY

Systems and methods are described for vehicle and machine diagnostic devices that that utilize voltage information obtained from a battery to predict anomalous behaviors in other systems whose operation correlated to the voltage of the battery. In some embodiments, a method to facilitate vehicle diagnostics is presented. The method can include measuring the voltage of a battery and an operating parameter of a machine. The battery may be an automotive battery or any other type of battery. The operating parameter may be more or more functions of a machine. For instance, the operating parameter may be the rotations per minute (RPM) output of an automobile, however it should be appreciated that the operating parameter is not limited to an automobile operating parameter nor is the operating parameter limited by number. The method continues by equating the voltage of the battery with the operating parameter to create a correlation between the voltage and the operating parameter.

In some circumstances, the operating parameter may have a direct or indirect affect on the battery voltage or vis-versa. A state or property of the operating parameter can be determined to be anomalous. The anomaly may be found, for example, when the correlation between the operating parameter and the voltage of the battery signifies that an anomaly has occurred. Once an anomaly has been detected, an alert can be generated which is indicative that the state or property of the operating parameter is anomalous. The correlation between the operating parameter and the battery voltage may be a direct correlation or an indirect correlation.

In some embodiments, the voltage, measured from the battery, can be mapped to the operating parameter using a machine learning engine or a machine learning algorithm. Once the measured voltage is mapped to the measured operating parameter, a predicative norm model can be constructed that includes predicted correlations between the voltage of the battery and the operating parameter. In accordance with various embodiments, the predicted correlations may be built over time by observing the relationship between the voltage and the operating parameter during normal operation of the machine or vehicle. Once the predicted correlations are constructed, the measured voltage and the measured operating parameter can be cross validated with the predicted correlations of the predictive norm model. When the measured voltage and the measured operating parameters differ from the predicted correlations of the model, an anomaly in the state or property of the operating parameter can be determined to exist. In contrast, when the measured voltage and the measured operating parameters align with the predicted correlations of the model, the state or property of the operating parameter is considered normal.

When an anomaly is first detected, the anomaly may be verified to actually exist by comparing the measured operating parameter with another known correlation. For example, a spike in a vehicle's RPM is correlated with how far down the acceleration pedal is pressed. In this example, if a spike in the vehicle's RPM is detected and this spike in speed is determined to be an anomaly, then a verification can be made to ensure that the spike in RPMs is an anomaly (e.g., by measuring how far down the acceleration pedal is pressed). In this case, if the pedal was found to not be pressed down when the spike in RPMs occurred, the anomaly would be verified.

Some embodiments provide for system that includes a processor, a battery monitor, a converter, a communications module, a machine learning engine, and/or other components. The processor may exist as a standalone component or may exist in the context of a microcontroller or other computing system that includes a memory and the other components. The battery monitor can collect voltage from the vehicle battery in real-time and generates a corresponding voltage signal. The convertor can be used to transform the voltage signal into a digital signal that is readable by the processor. The communications module can collect vehicle information from an in-vehicle network and in certain circumstances, may send alerts to smart phones or other on-board display systems to notify the vehicle operator. The machine learning engine can be configured to ingest, or otherwise take in, the vehicle information and the digital signal. In some embodiments, the machine learning engine may further generate a correlation between the vehicle information and the digital signal that can determine if an anomalous state exists within a vehicle system.

In some embodiments, the machine learning engine can be configured to map the digital signal to the vehicle information to create a one-to-one correlation between the digital signal and the vehicle information. Once this correlation is established, the machine learning engine may create a predictive norm model that includes predicted correlations between the digital signal and the vehicle information. After the predictive norm model is created, the machine learning engine can compare the one to one correlation between the vehicle signal and the digital signal with the predicted correlations of the model. In some situations, the machine learning engine can determine that a state of one or more vehicle systems is anomalous when the one to one correlation between the digital signal and the vehicle information differs from the predicted correlations of the predictive norm model. To ascertain that an anomaly actually exists within the one or more vehicle systems, some embodiments of the machine learning engine can compare the vehicle information to other known correlations. Once an anomaly is known to exist, the communications system will then generate an alert and transmit the alert to the vehicle operator through either wireless or wired communication.

In various embodiments, a system can include a memory, a diagnostic module, a communications system, and/or other components. The memory can have stored thereon one or more predictive correlations between the voltage of a battery and one or more operating states of components within a machine. The diagnostic module can be used to determine an operating condition of the machine, and whether the operating condition of the machine exists in a normal or in an anomalous state. In some embodiments, the normal state may indicate a convergence between the predictive correlations of the memory and the operating condition of the machine. Similarly, the anomalous state may indicate a divergence between the predictive correlations of the memory and the operating condition of the machine. When an anomalous state has been detected, the communication system can generate an alert that the state of the operating condition of the machine is anomalous.

In some embodiments, the diagnostic module can use machine learning to associate measured voltage signals of the machine to the measured operating states of the machine to create a correlation between the voltage signals and the operating states. For example, the operating state of the machine may be automobile acceleration. In this example, the diagnostics model can create an association between the measured voltage signals of the battery and the acceleration of the automobile. For instance, an increase in acceleration may indicate an increase in measured voltage signals.

In some embodiments, the diagnostics module can compare the correlation between the measured voltage signals and the operating states of the machine with the predictive correlations of the machine. When the correlation between the measured voltage signals and the operating states of the machine differ from the predictive correlations of the memory, the diagnostics module determines that an anomaly has occurred in the operating condition of the machine. The diagnostics module can then verify that the anomaly is real by comparing the operating condition of the machine with other known correlations. Following the verification of the anomaly, the communication module can generate alert.

Various embodiments of the present technology relate to a battery-based diagnostics system that guards vehicles against anomalies in real-time. In certain embodiments, the diagnostics system can be implemented as an add-on module that is attached to automotive batteries. The diagnostics module relies, in part, on the physically induced correlations between the battery voltage and other operational parameters of the vehicle such as engine RPM. The diagnostics system can exploit these correlations to diagnose vehicles by utilzing automotive batteries as anomaly sensors. In some embodiments, the diagnostics system can cross-validate vehicle information with online constructed norm models with regard to the battery voltage, steered by a dataset collected during normal operation.

Prototype systems adhering to one or more embodiments of the present technology were implemented on a 2018 Subaru Crosstrek® for over 3 months. Additionally, some embodiments of diagnostics system were evaluated based on the driving traces collected with a 2008 Honda Fit®, a 2018 Volvo XC60®, and a 2017 Volkswagen Passat®. During field tests, the diagnostic system was able to detect anomalies in vehicle information with over an 86% detection rate on average.

Embodiments of the present technology also include computer-readable storage media containing sets of instructions to cause one or more processors to perform the methods, variations of the methods, and other operations described herein.

While multiple embodiments are disclosed, still other embodiments of the present technology will become apparent to those skilled in the art from the following detailed description, which shows and describes illustrative embodiments of the technology. As will be realized, the technology is capable of modifications in various aspects, all without departing from the scope of the present technology. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

Figure 1:
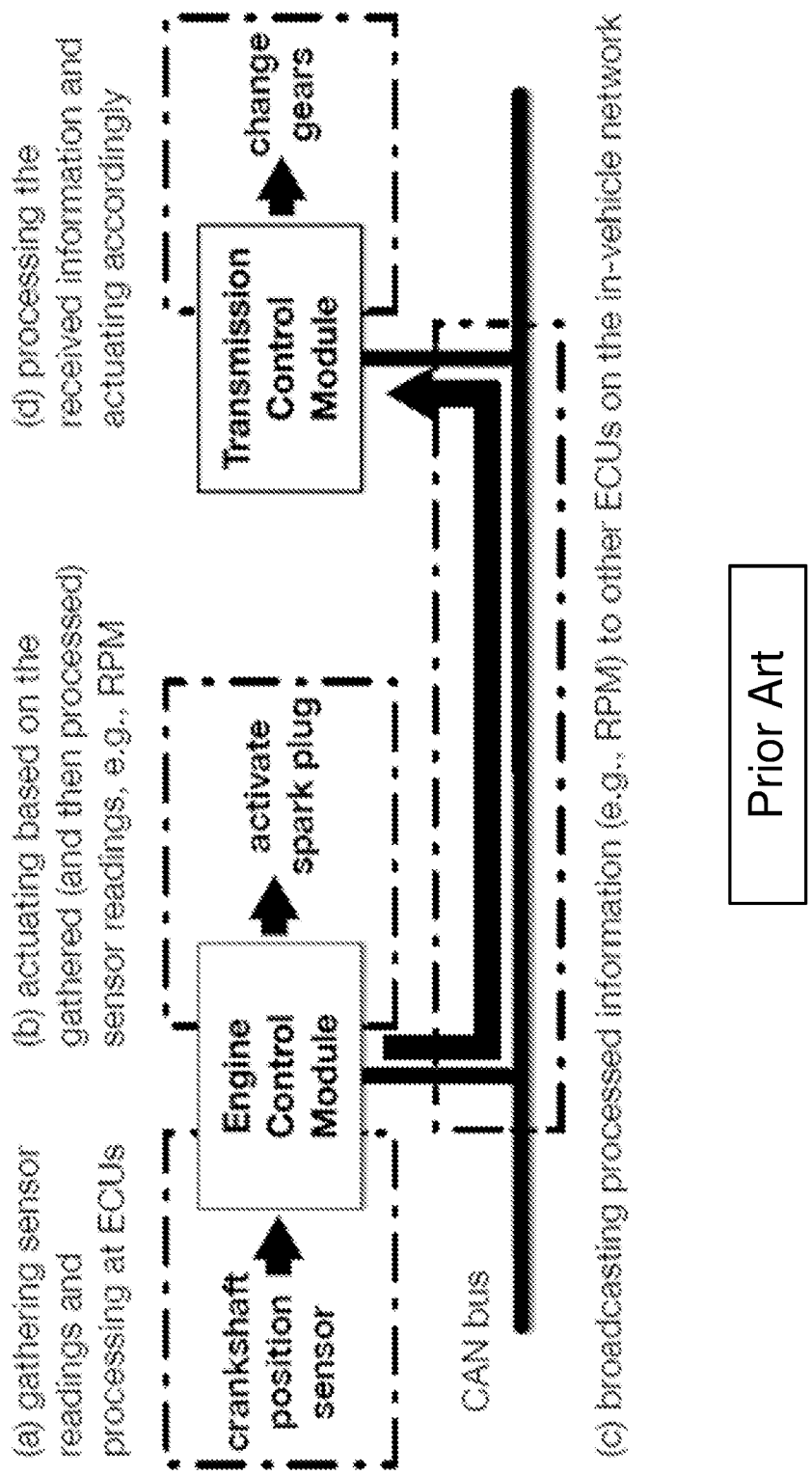
FIG. 1 illustrates an example of a vehicle's typical cyber operations that can include gathering, processing, transmitting/receiving information and actuating accordingly.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally relate to vehicle diagnostics. More specifically, the embodiments of the present technology relate systems and methods to diagnose vehicles based on the link between the voltage of automotive batteries and out vehicle outputs. For instance, a spike in a vehicles speed would correlate to a change in the voltage of the automotive battery in the vehicle. Using these relationships, changes in the voltage of the vehicle's battery can be used to predict changes in other vehicle systems.

To mitigate these risks associated with the implementation of software-based systems in modern vehicles, some embodiments of the present technology provide a battery-based diagnostic system (referred to hereinafter as "B-Diag") that guards vehicles against anomalies with a cyber-physical approach and implements B-Diag as an add-on module of commodity vehicles attached to automotive batteries, thus providing vehicles an additional layer of protection. B-Diag is inspired by the fact that the automotive battery operates in strong dependency with many physical components of the vehicle, which is observable as correlations between battery voltage and the vehicle's corresponding operational parameters (e.g., a faster revolutions-per-minute (RPM) of the engine, in general, leads to a higher battery voltage). Various embodiments of B-Diag exploit such physically induced correlations to diagnose vehicles by cross-validating the vehicle information with battery voltage, based on a set of data-driven norm models constructed online or in the vehicle in real time. A proof of concept design of B-Diag is steered by a dataset collected with a prototype system when driving a 2018 Subaru Crosstrek® in real-life over 3 months, covering a total mileage of about 1,400 miles. Besides the Crosstrek®. Further proof of concept prototypes of a B-Diag have also been evaluated based on driving traces of a 2008 Honda Fit®, a 2018 Volvo XC60®, and a 2017 Volkswagen Passat®, showing B-Diag detects anomalies in vehicle information with an 86%-99% detection rate on average.

The automotive industry is increasingly employing software-based solutions to provide value-added features on vehicles. For example, such value added features may include automatic crash response or remote diagnostics. These value added features are becoming even more prevalent with the advent of (hybrid) electric vehicles and/or autonomous driving. As a result, modern vehicles are commonly installed with software systems consisting of hundreds of millions of lines of codes distributed across a multitude of Electronic Control Units (ECUs), rendering vehicles prototypical cyber-physical systems (CPSes). The ever-increasing cyber components of vehicles, however, prove to be a double-edged sword and incur new risks to vehicles' reliability and safety.

Vehicle software systems become error-prone with the ever-growing data volume in the in-vehicle network. As an example: (a) the vehicle's engine control module first gathers readings of the crankshaft position sensor to calculate the RPM1, and then (b) actuates based on the thus-calculated RPM to control the activation frequency of spark plug, (c) the engine control module also broadcasts the RPM to other ECUs via the in-vehicle network (e.g., in form of the controller area network), (d) the transmission control module receives and then processes the broadcasted RPM, and changes gears accordingly. As can be seen, any software defects in the computation, communication, and/or control of the above process could compromise the gear shifting.

Unfortunately, software flaws have been frequently identified in vehicles. For example, a bug causing unintended acceleration forced Toyota® to recall at least 7.5 million vehicles between 2009-2011. In another example, a glitch unlocking the door without notifying drivers caused Jaguar® to recall around 65,000 Range Rover® vehicles in 2015. In a further example of a vehicle software glitch, defects in the cruise control software caused Chrysler® to recall around 4.8 million vehicles in 2018.

Second, the proliferation of in-vehicle sensing, and communication modules eases the inter-connection between cars and third-party devices, thus exposing new vulnerabilities to cyberattacks. For example, it is now possible to inject and modify data packets in the in-vehicle network through WiFi, Bluetooth, or other cyber interfaces have been reported. It has been shown that is possible to stop a Jeep Grand Cherokee® on a highway by masquerading with its in-vehicle data packets. This event triggered a recall of around 1.4 million vehicles by Jeep® in 2015.

These risks, albeit of different causes, lead to the same consequence of unintended information in the in-vehicle network, referred to as cyber anomalies, disrupting the automotive industry and degrading vehicles' reliability and safety.

Vehicle anomalies are traditionally diagnosed with the On-Board Diagnostics System (OBD-II). OBD-II is ineffective in detecting these cyber-induced anomalies, as demonstrated by the fact that many of the above cyber flaws/attacks do not trigger any diagnostic trouble in the code of OBD-II. To fill this need of anomaly diagnostics, various solutions such as message authentication and intrusion detection have been attempted. However, these solutions still suffer from at least the following three deficiencies.

First, these solutions are defective in systematically exploiting a vehicle's CPS nature. For example, a system of sub-systems interacting constantly in the cyber and physical spaces misses a reliable opportunity in vehicle diagnostics. Second, these solutions are commonly implemented at vehicles' ECUs as part of the in-vehicle network, and thus also suffer from the risks of anomalies thereof. For instance, the diagnostics systems (ECUs) themselves could be abnormal. Last but not the least, many existing solutions are grounded on an offline knowledge of known vehicle anomalies, thus being defective in adapting to unexpected but inevitable vehicle dynamics.

It is with respect to these various deficiencies in current vehicle design that the present invention has been made. To mitigate these deficiencies, various embodiments provide for a novel battery-based diagnostic system for vehicles, called B-Diag, and implement B-Diag as an add-on module of commodity vehicles attached to automotive batteries, thus providing vehicles an additional layer of protection on top of the traditional OBD-II. For example, various embodiments include one or more of the following technical effects, advantages, and/or improvements: 1) diagnosing anomalies in vehicle systems with a cyber-physical approach; 2) using automotive batteries as sensors; 3) constructing relationships between a variety of vehicle performance metrics and the change in voltage of the automotive battery; 4) incorporating Bluetooth devices to send alerts to the on-board vehicle display system or to a smartphone when an anomaly has been detected in a vehicle system; 5) integrating machine learning engines to construct predictive models which are then compared with incoming vehicle information to detect anomalies in vehicle performance; and/or 6) confirming that detected anomalies have occurred by comparing measured vehicle outputs with other known correlations. Some embodiments include additional technical effects, advantages, and/or improvements to computing systems and components embedded in vehicles or other machines.

In the following description, for the purposes of explanation, numerous specific details are set forth in order to provide a thorough understanding of embodiments of the present technology. It will be apparent, however, to one skilled in the art that embodiments of the present technology may be practiced without some of these specific details. While, for convenience, embodiments of the present technology are described with reference to vehicle diagnostic devices that utilize changes in a vehicle battery voltage to diagnose various other vehicle performance metrics such as rotations per minute (RPM), speed, breaking power, or any other related metric. The diagnostic module can build correlations between the voltage of the vehicle battery and any other vehicular output and use these correlations to construct a predictive model. Once the predictive model is constructed, the diagnostics module compares, in real time, the battery voltage and any other vehicular output with the predicative model to determine when anomalies occur in the vehicle. Anomalies can include a variety of out of the ordinary vehicular outputs such as a spike in RPM, an incorrect speedometer reading or any other anomalous behavior that affects vehicle performance.

The techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

In accordance with various embodiments, the foundation of B-Diag is the fact that many physically inter-connected modules of the vehicle operate in close dependency. For instance, a faster engine RPM increases the alternator's output current which in turn increases the automotive battery's voltage. This dependencies are observable as correlations among the vehicle's operational parameters in the cyber space. Some embodiments of B-Diag will exploit such correlations to diagnose vehicles with a cyber-physical approach by: (i) capturing the physically-induced correlations in the cyber space with data-driven norm models constructed online, and (ii) detecting (and then verifying) vehicle anomalies by cross-validating, in real-time, the vehicle information. These online constructed norm models also make B-Diag adaptive to the inevitable changes in vehicles.

B-Diag's cross-validation of vehicle information, however, requires a trustworthy ground, to which no information from the in-vehicle network satisfies due to the risks of cyber-induced anomalies. As a mitigation, some embodiments of B-Diag will ground its cross-validation on the voltage of automotive batteries by exploiting batteries as sensors. Battery voltage can be reliably (and easily) collected from the physical batteries without going through the in-vehicle network, thus serving as the hardware-based root of trust and making the cross-validation reliable. Additionally, a battery operates in strong dependency with many vehicle modules, and thus battery voltage correlates with many vehicle parameters, making the cross-validation effective. This way, B-Diag's anomaly detection, by grounding on the physically collected battery voltage, is robust and effective even when the in-vehicle network is compromised. Such a battery-based diagnostics of B-Diag also magnifies its practicality because no re-designing of existing ECUs or the in-vehicle network is needed. This is beneficial for the cost-conscious automotive industry which exhibits only a 4%-9% profit margin.

Table 1 summarizes the vehicle information that has been corroborated to be correlated with the battery voltage and diagnosable by B-Diag. It should be appreciated that other vehicle or machine information may be correlated with battery voltage and diagnosable by B-Diag.

TABLE 1

A (nonexclusive) list of vehicle information that are correlated with the battery voltage and corroborated to be diagnosable by B-Diag. Vehicle Information 1) Absolute Throttle Position B
2) Accelerator PedalPosition D
3) Accelerator PedalPosition E
4) Air Fuel Ratio (Commanded)
5) Air Fuel Ratio (Measured)
6) Commanded Equivalence Ratio
7) Engine Coolant Temperature
8) Engine Load
9) Engine Load (Absolute)
10) Engine RPM
11) Fuel Level (From Engine ECU)
12) Intake Manifold Pressure
13) Mass Air Flow Rate
14) O2 Sensor1 Equivalence Ratio
15) O2 Sensor1 Equivalence Ratio (alternate)
16) O2 Sensor1 Wide-Range Voltage
17) Throttle Position (Manifold)
18) Transmission Temperature (Method 1)
19) Transmission Temperature (Method 3)
20) Voltage (Control Module)
21) Voltage (OBD Adapter)
22) Volumetric Efficiency (Calculated)

The design of B-Diag is driven by a dataset collected with a prototype system when driving a 2018 Subaru Crosstrek® in real-life over 3 months, covering a total mileage of about 1,400 miles. Besides the Crosstrek®, some embodiments of B-Diag were also evaluated using driving traces collected from a 2008 Honda Fit®, a 2018 Volvo XC60®, and a 2017 Volkswagen Passat®, showing that B-Diag detects anomalies in vehicle information with over (86%-99%) detection rate on average.

Now referring to the Figures. FIG. 1 illustrates a traditional control system that may be implemented in a vehicle. Gathering sensors associated with one or more vehicle systems, such as a crankshaft position sensor, send the gathered information to the engine control module or some other control module associated with the particular system as hand. The gathered information is then used to actuate other systems, such as spark plug activation, to improve vehicle operation and prevent system breakdown. Once the adjustment has been made, the control module broadcasts the system change to the other control modules of the car such that they work in tandem. The other control modules, upon receiving this updated information, then adjust their operation accordingly to keep each vehicle system operating in tandem. However, due to the increasing software complexity of modern automobiles, these control systems may become disjointed or non-operative. Due to this, B-Diag may be inserted into the traditional control systems of an automobile to prevent many of the problems.

Figure 2:
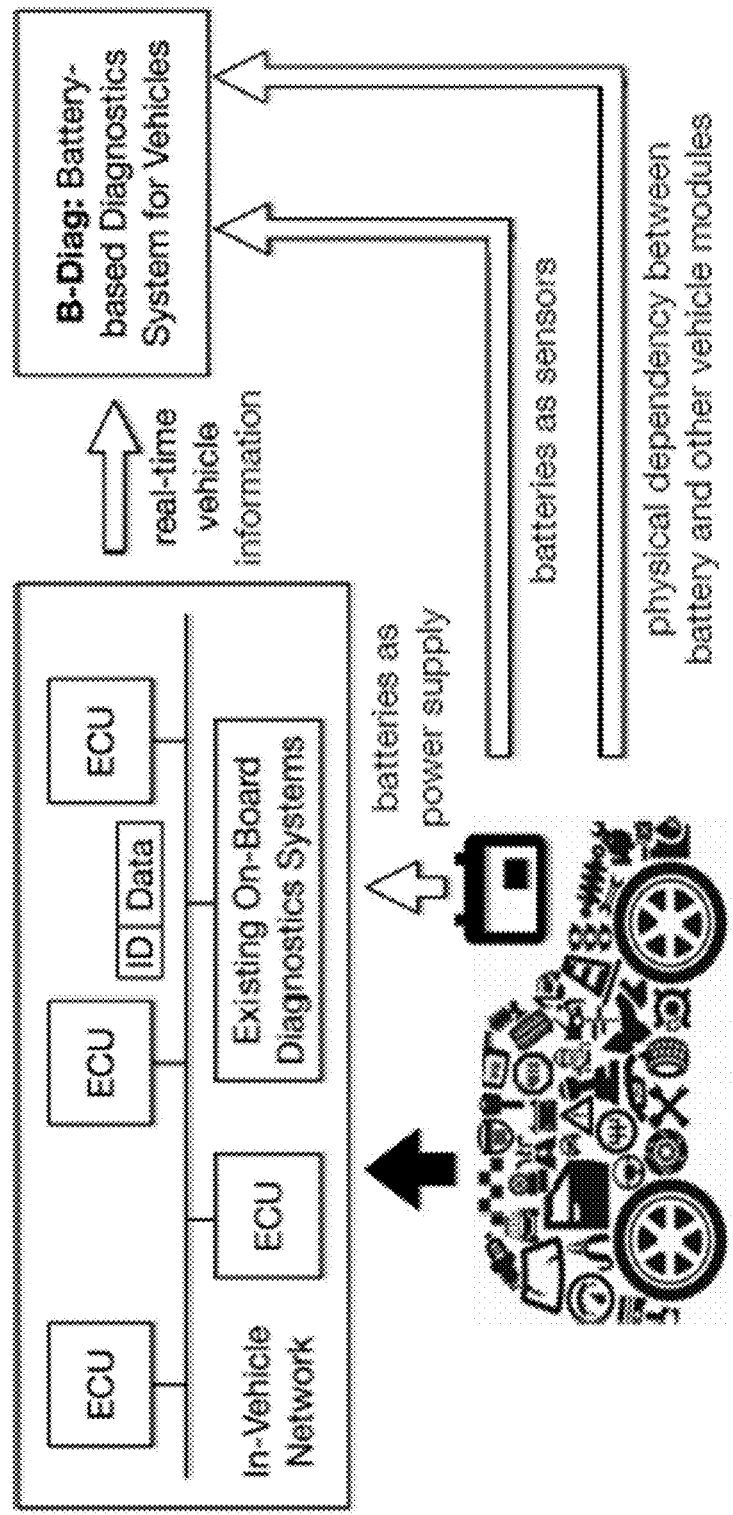
FIG. 2 illustrates a battery-based diagnostics system (B-Diag) according to one or more embodiments of the present technology.

FIG. 2 is an illustration to demonstrate how B-Diag may be implemented with respect to the existing control system. B-Diag is positioned to receive battery voltage information from the automotive battery. B-Diag is further positioned to take in real-time vehicle information from the pre-existing control system as described in FIG. 1. The physical dependency between the outputs of the control system, such as RPM, crankshaft position, or others, and the voltage of the battery is then determined by B-Diag. Once the physical dependency has been established, B-Diag may detect anomalous behavior in any vehicle system by receiving anomalous voltage signals from the automotive battery that to not align with the previously established physical dependencies of each vehicle system.

Figure 3A:
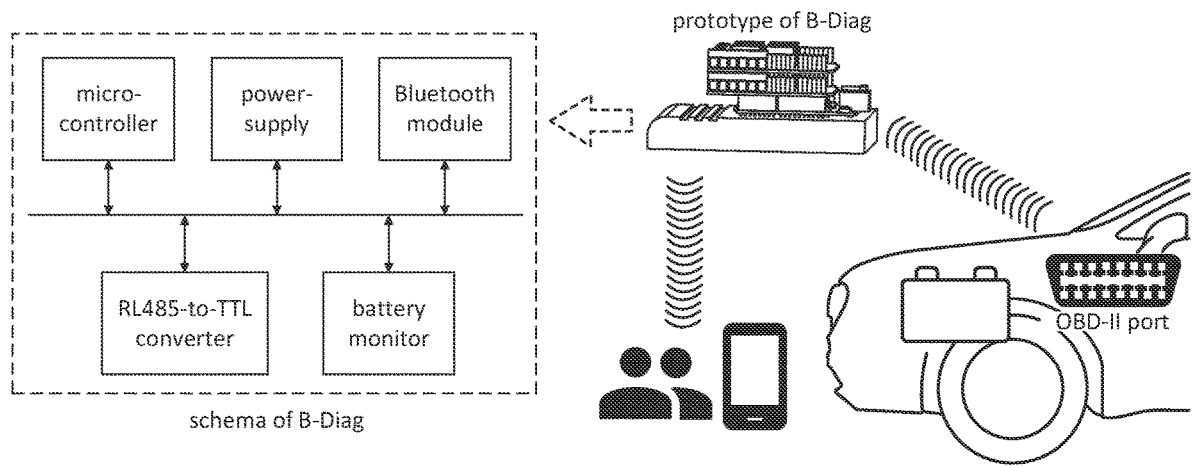
FIGS. 3a-3c illustrates an example of a B-Diag and its relationship to a standard automobile in accordance with one or more embodiments of the present technology.

FIG. 3a presents a B-Diag as an add-on module of commodity vehicles attached to their automotive batteries. In some embodiments, B-Diag includes a microcontroller (such as an Arduino®) attached to the automotive battery in the vehicle's engine cabin, a battery monitor collecting the voltage of the automotive battery in real-time, and a RS485-to-TTL converter transforming the voltage signal and sending it to the micro-controller. In some embodiments, B-Diag may further include a Bluetooth module collecting the vehicle information from the in-vehicle network (e.g. via the OBD-II port with off-the-shelf OBD-II adapters) and reporting the results to the smartphone or other on-board device of the vehicle's driver/owner. In some embodiments, B-Diag may further integrate a power supply supporting the above components.

Figure 3B:
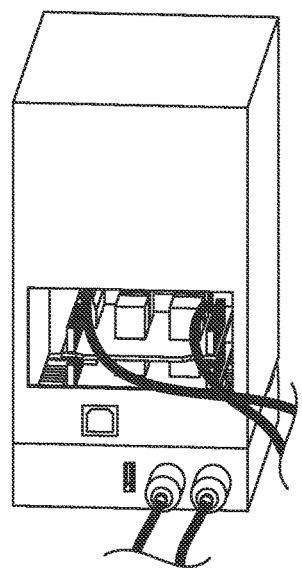
Figure 3C:
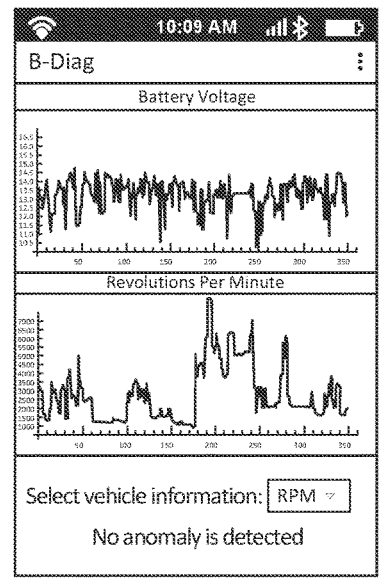

FIG. 3b is a photograph showing B-Diag installed in a 3D-printed protective case, however a variety of casing may be used to contain the B-Diag such as a metallic casing, a molded plastic casing, or any other suitable casing. FIG. 3c shows an example of the prototype's GUI on an Android® phone. Note the Bluetooth-based collection of vehicle information from the OBD-II port is only for the ease of implementation. In some embodiments, wired OBD-II adapters may be implemented and to further improve the reliability. In other embodiments, the power supply of the B-Diag may be removed and power may be source for the automotive battery to power the all of the functions of the B-Diag.

Figure 4A:
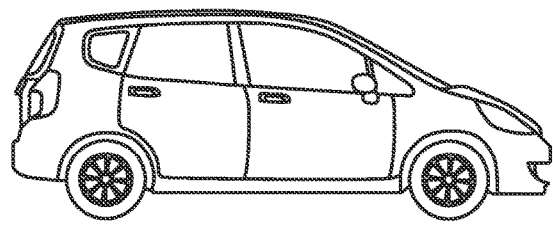
FIGS. 4a-4e illustrate a B-Diag prototype installed in a 2018 Subaru Crosstrek® according to some embodiments of the present technology.
Figure 4B:
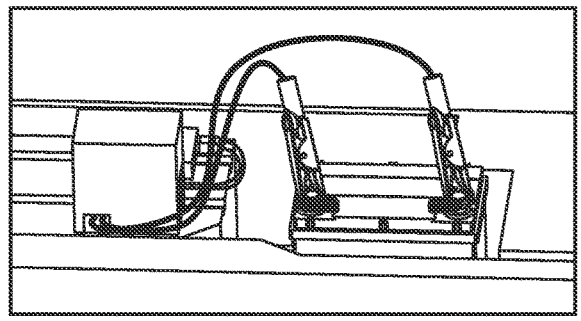
Figure 4C:
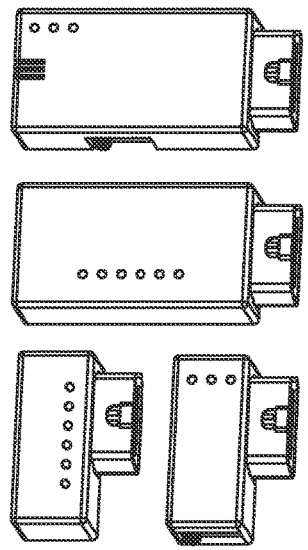
Figure 4D:
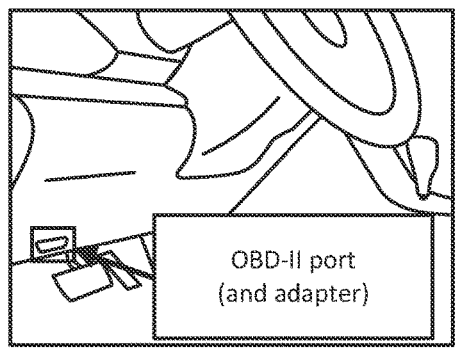

FIGS. 4a-4c show the prototype of B-Diag that was used to collect the real-life driving traces of a 2018 Subaru Crosstrek®, as shown in FIGS. 4a-4b. FIG. 4c is a photograph showing four Bluetooth OBD-II adapters that were used to collect the vehicle information via the OBD-II port at 10 Hz (FIG. 4(d)) and upload the information to B-Diag's prototype. This data was collected over 3 months, on both highway and urban roads, and also when driving during rush hour traffic jams and in snowing/raining weather, as summarized in FIG. 4e. No abnormal behavior of the vehicle is observed during the collection of these traces, which is also confirmed when performing its regular maintenance at the auto dealer. This way, these collected traces can be treated as normal. Another Bluetooth OBD-II adapter (not shown) was identified that is not reliable in collecting the driving traces. The "abnormal" vehicle information collected with this faulty adapter was used to evaluate B-Diag, as explained below.

Note that such an installment of B-Diag is general for all vehicles because as all automotive batteries have positive/negative terminals exposed to the environment. Thus B-Diag can be connected and then the battery voltage is collected. Additionally, OBD-II port that is positioned under the dash in virtually all modern vehicles, has been mandatory for all vehicles sold in the US since 1996 and Europe since 2001. Due to these circumstance, well-defined vehicle information can be collected in real-time without knowing the vehicle architecture or the format of the in-vehicle messages. Therefore, B-Diag is not limited to the type of vehicle that is installed into. Additionally, it should be recognized that B-Diag is not limited to commuter vehicles, and that the devices and techniques described herein could be extrapolated to a other machines or vehicles that exhibit a machine function-voltage dependency such as construction equipment, industrial machinery, or battery powered medical devices.

Knowing the hardware components of B-Diag, various embodiments of B-Diag's diagnostic techniques are explained below, with some embodiments being related to the empirically collected driving traces. First B-Diag's detection of anomalies in engine RPM are used as an example to walk through its diagnostics of vehicles. The related techniques are also applicable to the detection of anomalies in other vehicle information listed in Table 1, as elaborated below. Next, the physically induced correlations between the automotive battery and vehicle's engine are presented.

To illustrate some embodiment of the present invention, a brief overview of the relationship between the function of an automotive battery and the relationship between the automotive battery and RPM is provided. An automotive battery is normally a rechargeable lead-acid battery with 12/24V nominal voltage depending on vehicle type. The battery supplies the necessary current to the starter motor and the ignition system while cranking to start the engine. The battery will be charged by the vehicle's alternator once the engine is running. Note that even (hybrid) electric vehicles such as Chevrolet Volt®, which use high-voltage (e.g., up to 400V) battery packs to supply the driving power also have low-voltage batteries, ensuring their compatibility to standard 12/24V automotive accessories.

Revolutions per minute (RPM) is the metric quantifying the engine speed, defined as the number of rotations per minute made by engine's crankshaft and monitored by the crankshaft position sensor in real-time. RPM is crucial to engine's timing functions for ignition, fuel injection, spark events, and valve timing. For example, RPM is needed to determine the activation frequency of spark plugs, normally every 10-17 milliseconds, to control the fuel injection to each cylinder in real-time. As a result, inaccurate RPMs cause a variety of problems such as misfiring, motor vibration, backfires, hesitant acceleration, abnormal shaking, or, the car may not start. It has been demonstrated that the feasibility of fabricating engine RPM, rendering abnormal RPM a real-life risk. For example, fabricating a large RPM to a low level could falsely convince the Power Steering Control Module (PSCM) that the vehicle is driving slowly, thus tricking PSCM to start a diagnostic session even when driving on a highway, causing critical safety risk.

Figure 5:
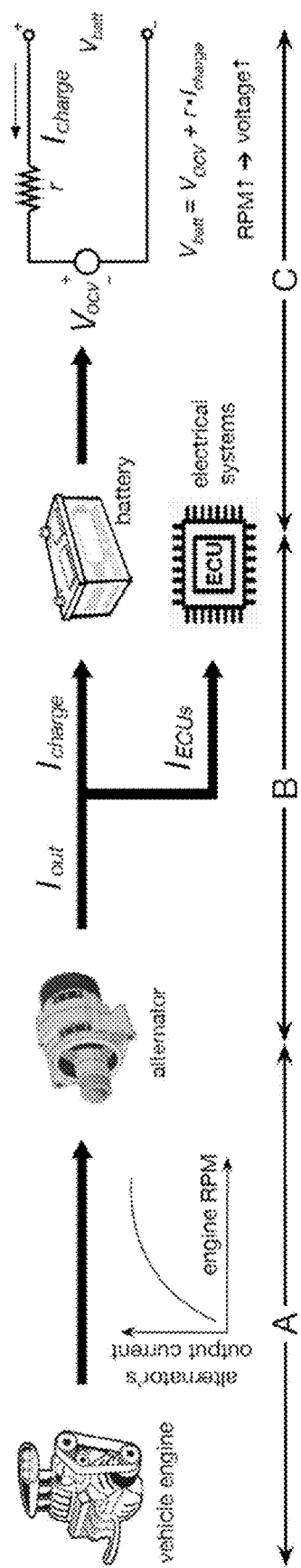
FIG. 5 illustrates the working relationship between the revolutions per minute (RPM) of an automotive engine and the voltage of an automotive battery according to some embodiments of the present technology.

FIG. 5 illustrates relationship between the automotive battery, the engine, the alternator, and the electrical system of an automobile. First, the engine's rotation triggers the alternator at a speed about 1 to 3 times that of engine RPM. The alternator's rotation, in turn, generates an electric power that is monotonic to its rotation speed (up to a certain safe level). This way, a faster RPM leads to a larger output current $I_{out}$ of the alternator (see part-A of FIG. 5). Second, part of the alternator's $I_{out}$ is used to power the vehicle's electrical systems, and the remaining current charges the battery. Other things being equal, a larger $I_{out}$ increases the battery's charging current (see part-B of FIG. 5). Third, a larger charging current increases the battery voltage. This can be explained by the battery's circuit model shown in Part-C of FIG. 5. The battery will have a voltage of $V_{batt}=V_{ocv}+r^*I_{charge}$ when charging with current $I_{charge}$ and where r is the internal resistance of the battery. Combining the above three facts uncovers a dependency between the automotive battery and engine induced by their physical design/connection, that the battery voltage increases with an increase in engine speed.

Next whether such a dependency between battery and engine could be observed as correlation between the corresponding operational parameters of the vehicle is evaluated.

Figure 6:
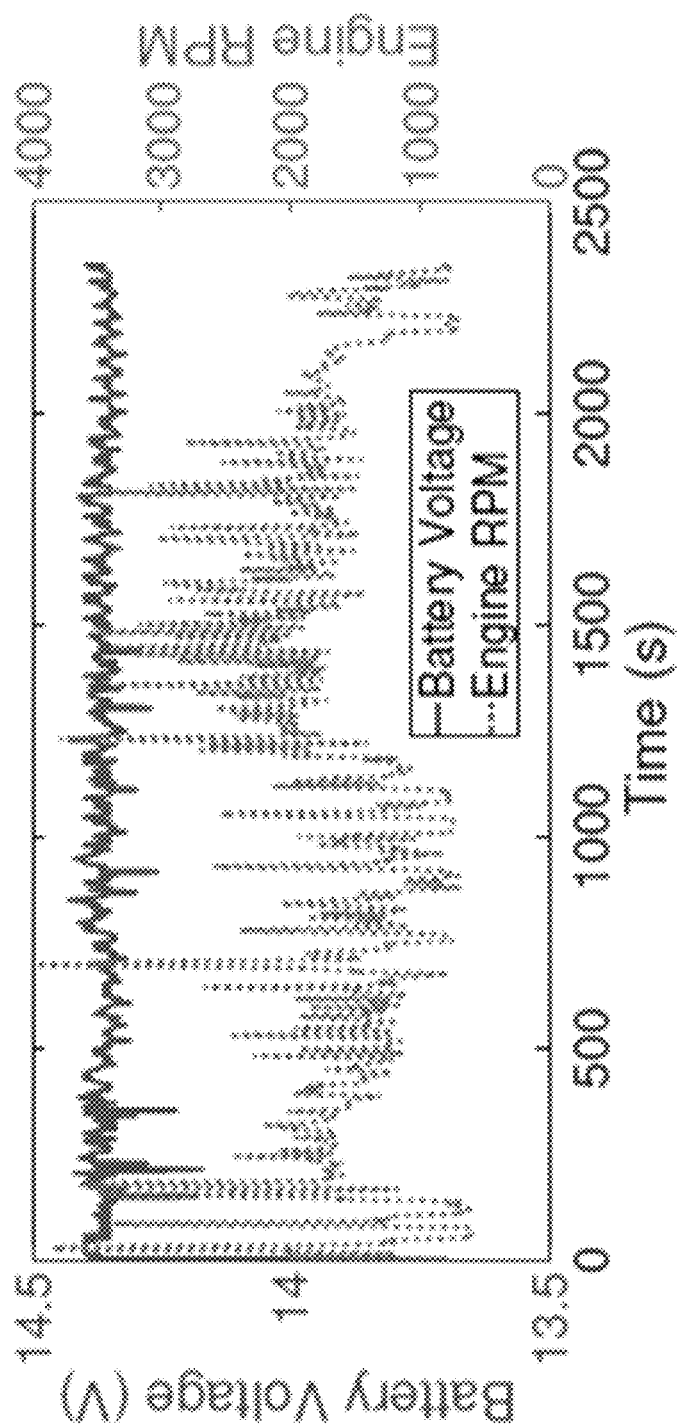
FIG. 6 is a plot illustrating the relationship between battery voltage and engine RPM in accordance with some embodiments of the present technology.
Figure 7A:
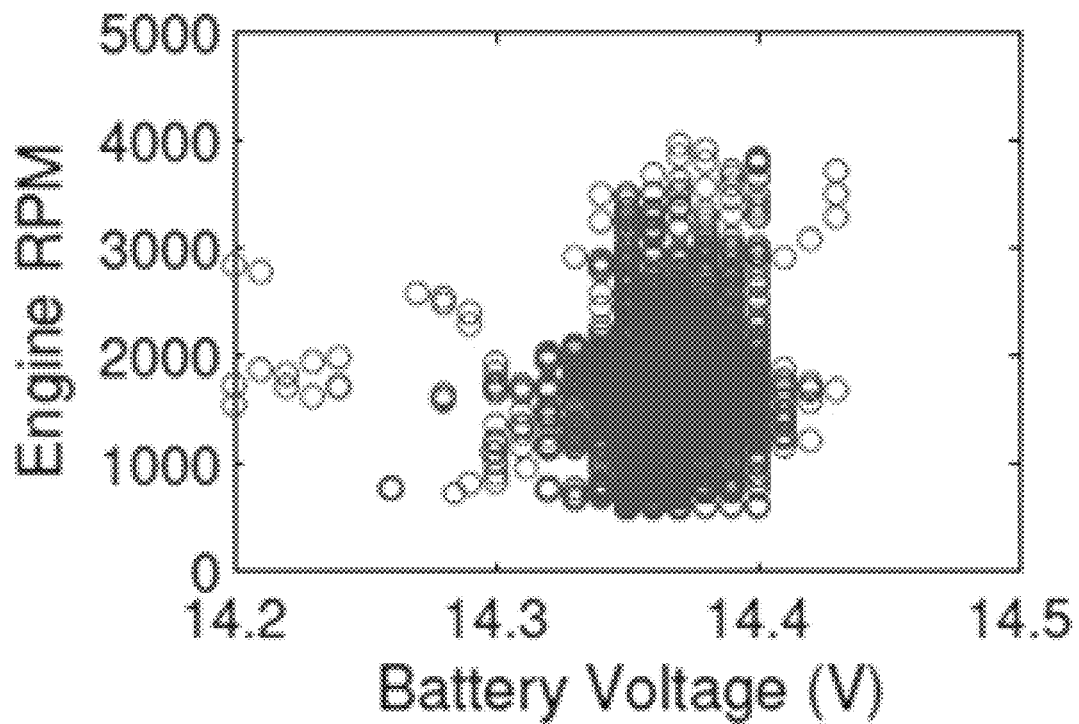
FIGS. 7a-7b illustrate the correlation between battery voltage and engine RPM in accordance with one or more embodiments of the present technology.
Figure 7B:
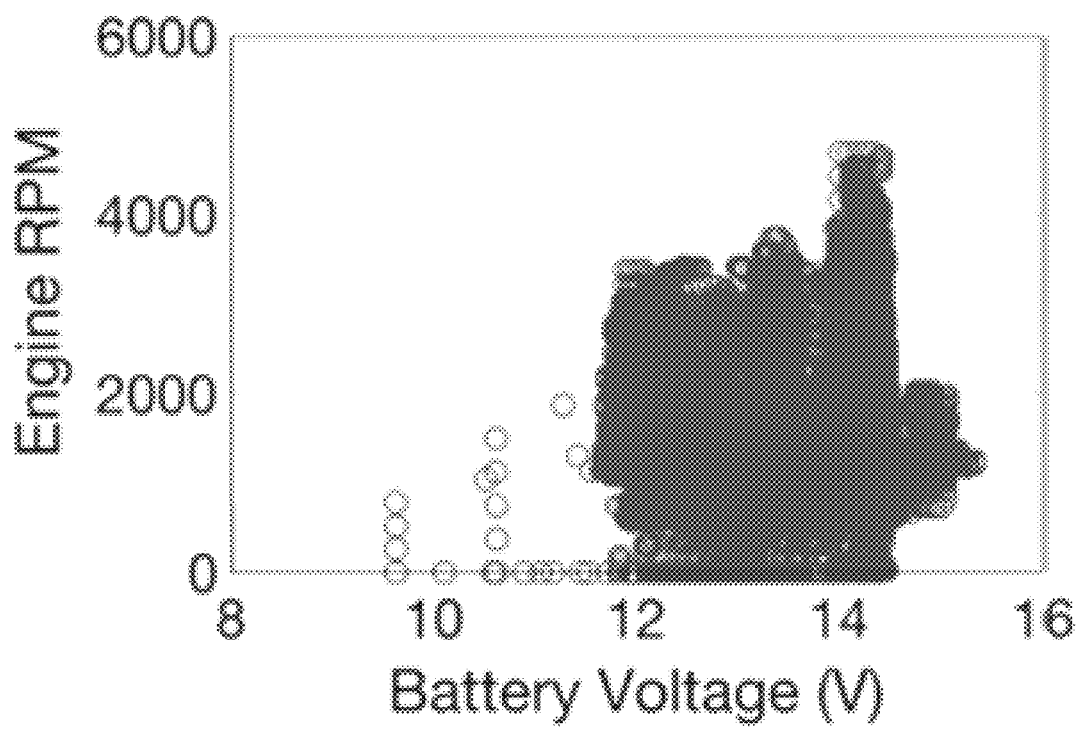

FIG. 6 shows a plot of the traces of battery voltage and engine RPM during a 39-minute driving trip, and FIG. 7a shows the corresponding scatter plot, confirming their dependency that a larger RPM, in general, leads to a higher voltage. Significant variance, however, is observed when the battery voltage varies in a wide range of [14.2,14.4]V when the RPM is about 2,000, thus rendering such a correlation weak. FIG. 7b plots all the voltages and RPMs of the 64 traces, confirming again such weakly correlated raw readings of battery voltage and engine RPM. A potential explanation for such a weak correlation is that the battery voltage is affected by, besides the engine RPM, a variety of other factors, such as the power requirements of the vehicle's electrical systems (i.e., $I_{ECUs}$ in FIG. 5), and thus rendering the battery voltage highly dynamic.

Figure 8A:
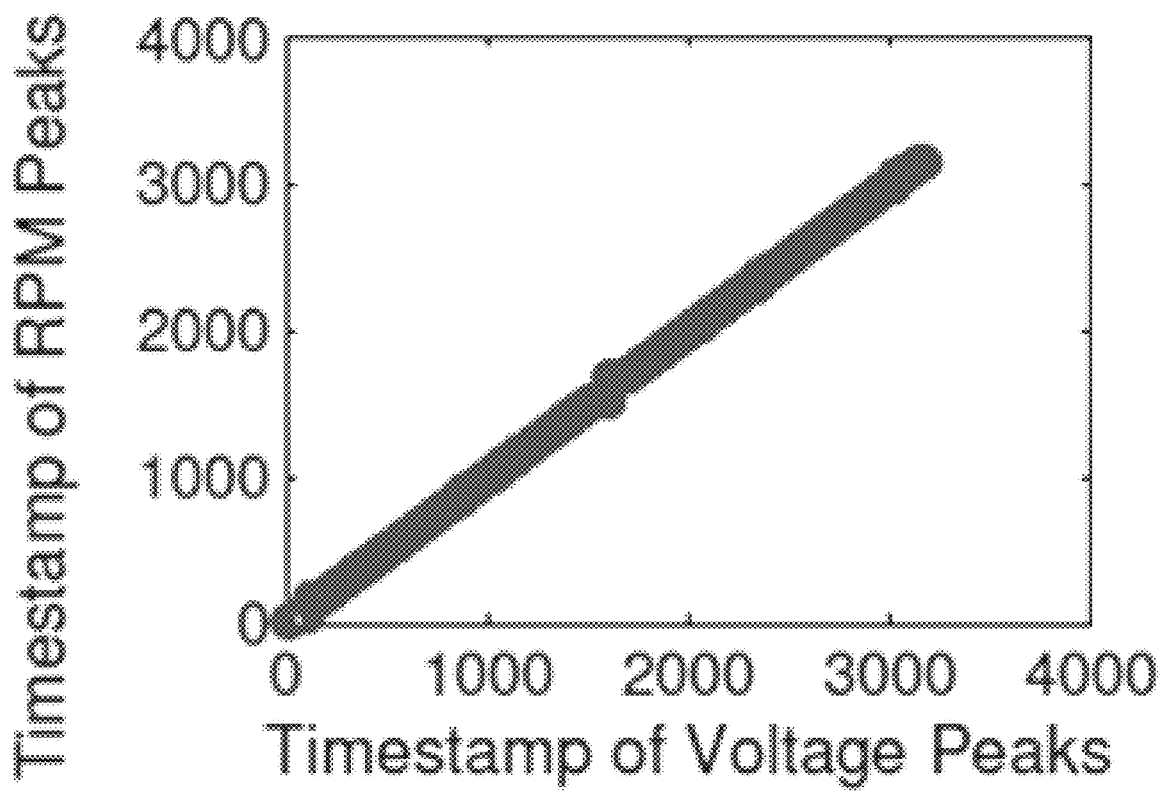
FIGS. 8a-8b illustrate the correlation between peaks in engine RPM and peaks in voltage according to one or more embodiments of the present technology.
Figure 8B:
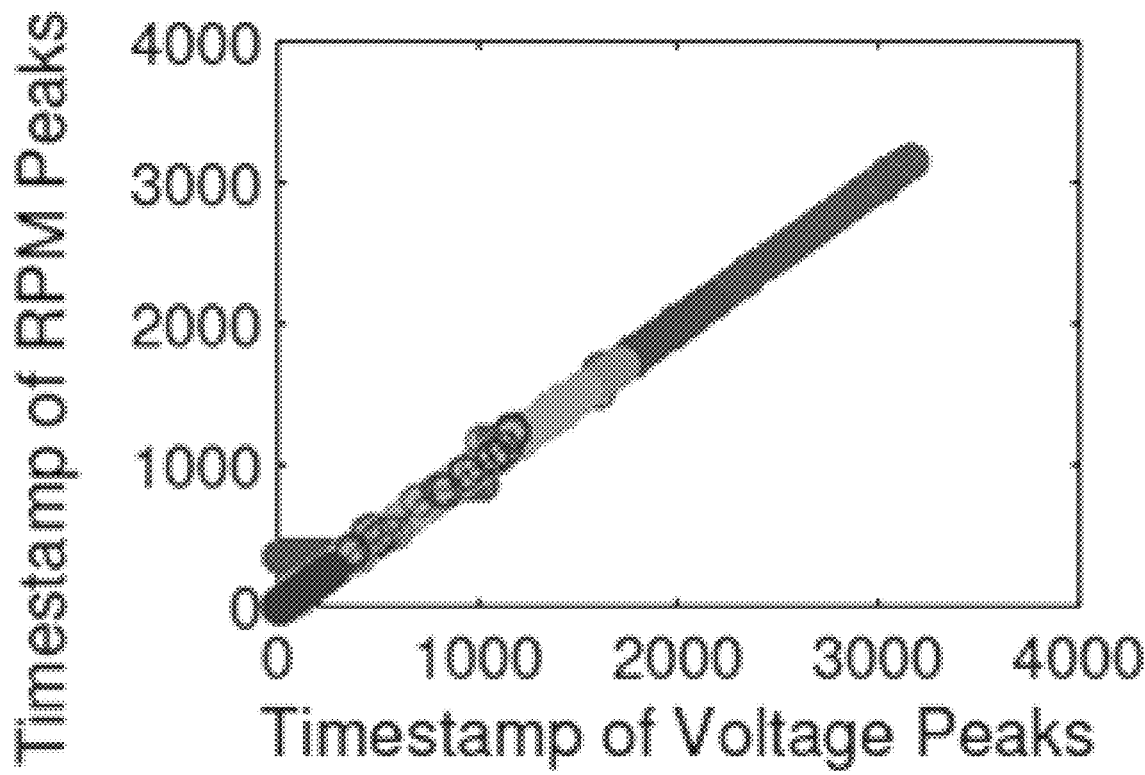

The local maximums of the RPM/voltage readings in FIG. 6, referred to as peaks, are identified and then use dynamic time warping to align these peaks' time-stamps, as shown in FIG. 8a. The close-to-diagonal warp path indicates various embodiments can find a voltage peak at a similar time whenever an RPM peak is observed, i.e., the peaks of battery voltage and engine RPM are synchronized (and hence correlated). FIG. 8b plots the warp paths obtained by aligning the RPM/voltage peaks of all the 64 Crosstrek® traces validating again such strongly correlated RPM/voltage peaks.

Figure 9:
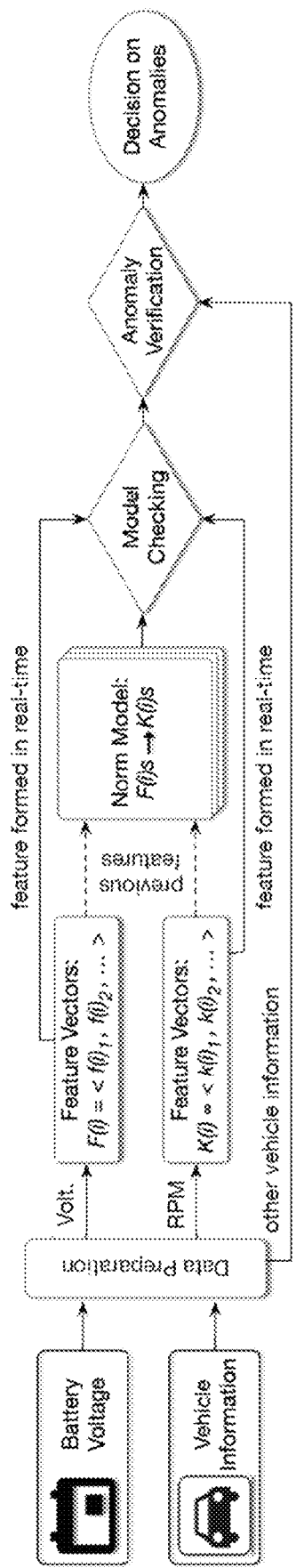
FIG. 9 is a block diagram illustrating diagnostic methods according to some embodiments of the present technology.

B-Diag exploits the above two correlations between the battery voltage and engine RPM to detect the potential anomalies in RPM readings. FIG. 9 shows an overview of B-Diag's detection of potential anomalies in engine RPM: taking as input (i) the real-time battery voltage collected from the battery directly and (ii) the engine RPM from the in-vehicle network, B-Diag outputs an online decision value indicating if anomalies are detected in RPM readings. B-Diag may conduct such an anomaly detection with three steps: data preparation, norm model construction, and anomaly detection, however additionally steps may be taking depending on the type of correlation.

Figures 10A, 10B:
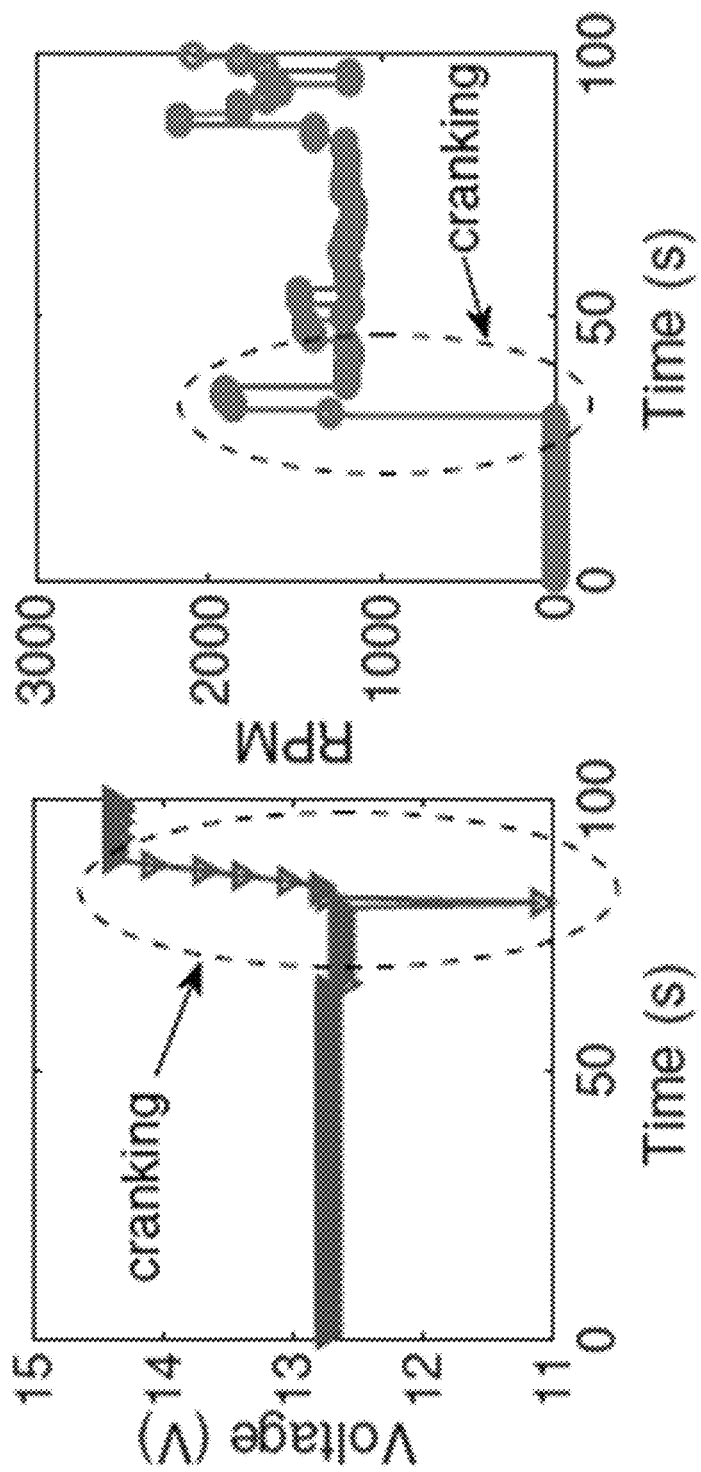
FIGS. 10a-10b show plots illustrating time domain alignment between voltage and RPM according to some embodiments of the present technology.

In some embodiments, B-Diag applies a set of operations to prepare the collected battery voltage and engine RPM before constructing the norm model. B-Diag can collect battery information from the battery and vehicle information from the in-vehicle network. Such different approaches of data collection can make the collected battery voltage and engine RPM not aligned in the time domain. B-Diag can align the data by exploiting the engine's cranking time as the anchor, which can be reliably identified based on the fact that both the battery voltage and engine RPM keep stable before cranking and then change abruptly and significantly while cranking, as shown in FIGS. 10a-10b. B-Diag detects the cranking time by identifying the local min/maximums of voltage/RPM with significant magnitudes and are proceeded by stable readings.

Figure 11:
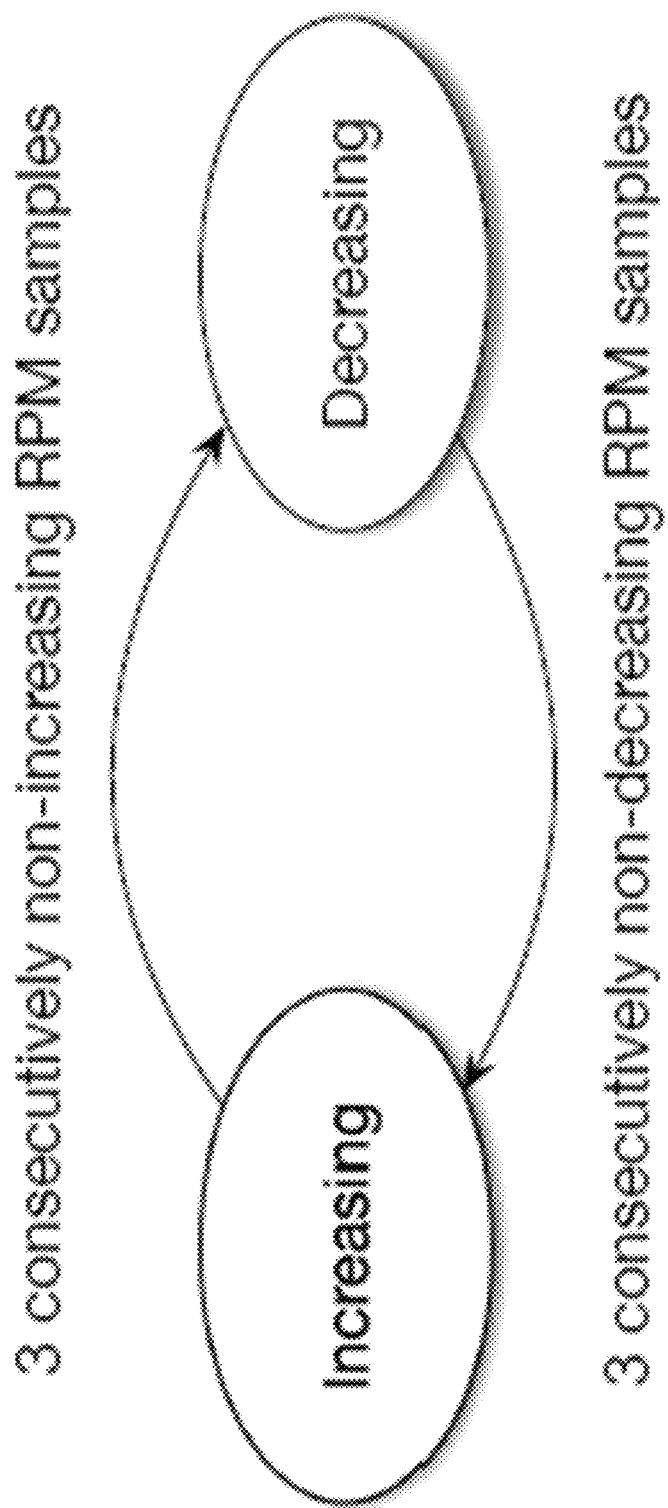
FIG. 11 is a diagram illustrating a diagnostic operating mode according to one or more embodiments of the present technology.

FIG. 11 is a diagram illustrating an operating cycle of B-Diag according to one or more embodiments. B-Diag, besides collecting and recording the battery voltage and engine RPM, also checks the RPM to determine, in real-time, if a new RPM peak is observed, and triggers its diagnostics of potential anomalies if an anomaly is observed. Specifically, B-Diag identifies and maintains the current trend of RPMs as increasing or decreasing where a peak is detected if the trend changes from increasing to decreasing. B-Diag confirms such a change in trend only when it has been observed with three consecutive RPM samples, as illustrated in FIG. 11, reducing the variance in the peak detection caused due to signal dynamics.

B-Diag maintains the time at which the previous RPM peak is observed, denoted as $t_{pre}$. Once detecting a new RPM peak, B-Diag constructs a time window of $[t_{pre}, T_w, t_{pre}]$, where $T_w$ is the window size. The time window terminates at $t_{pre}$, instead of the current time $t_{now}$, because not all the properties of the newly detected RPM peak can be determined at $t_{now}$.

Figure 12:
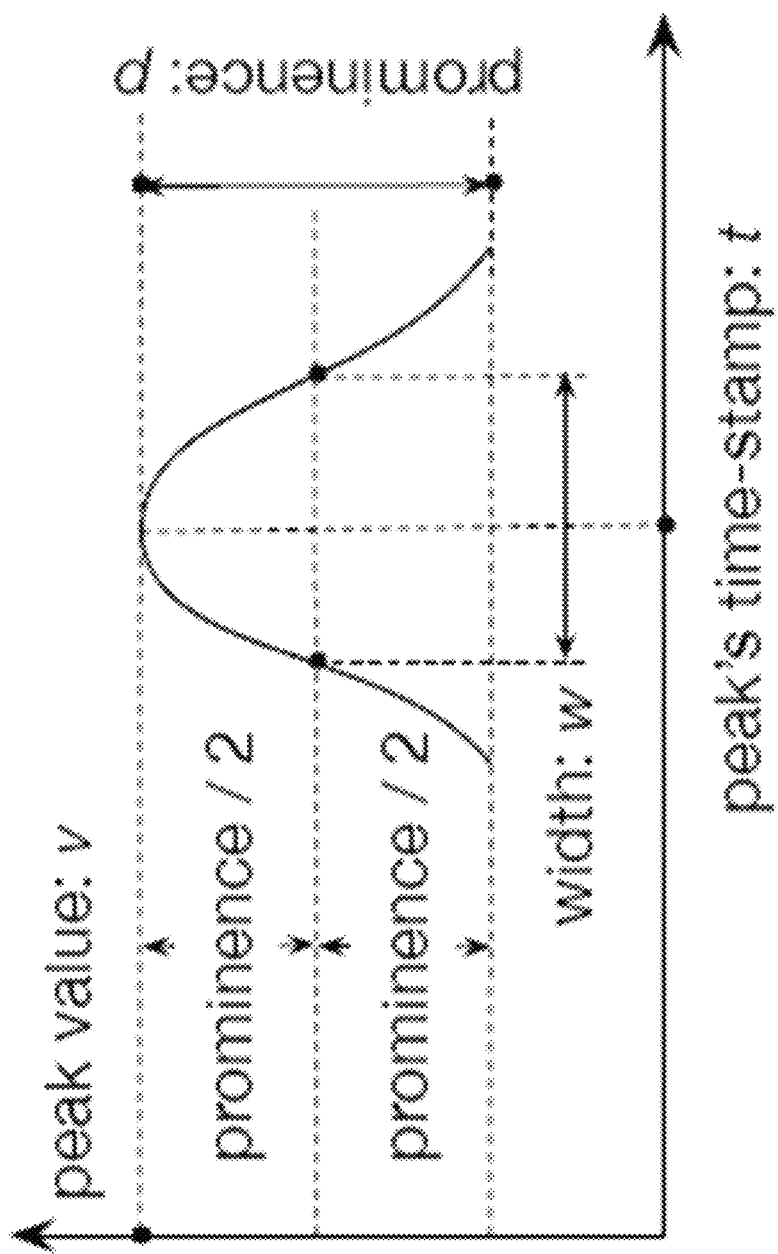
FIG. 12 is a plot describing a peak according to one or more embodiments of the present technology.
Figure 13A:
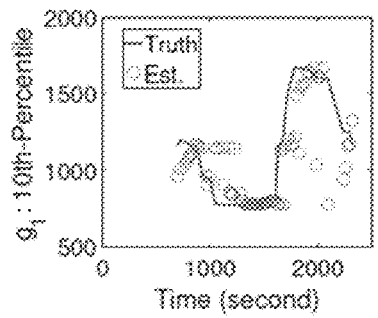
FIGS. 13a-13j are plots estimating the features of engine RPM based on those of battery voltage according to one or more embodiments of the present technology.
Figure 13B:
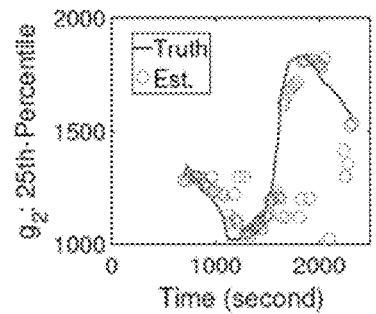
Figure 13C:
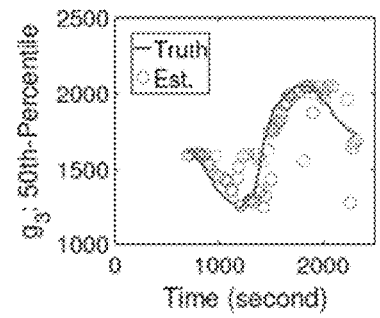
Figure 13D:
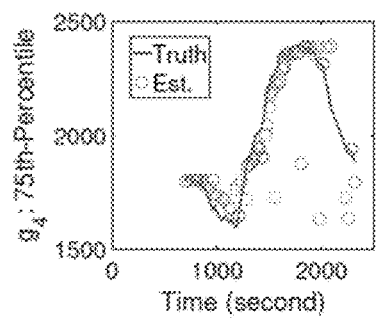
Figure 13E:
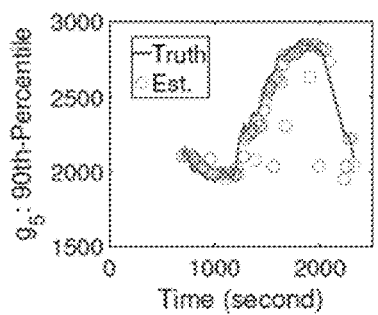
Figure 13F:
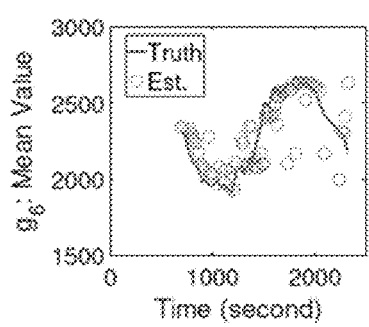
Figure 13G:
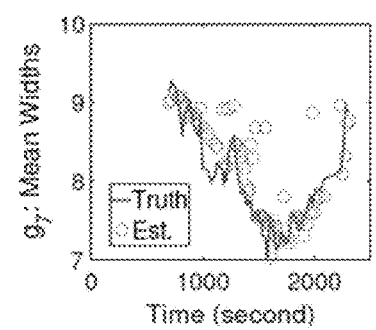
Figure 13H:
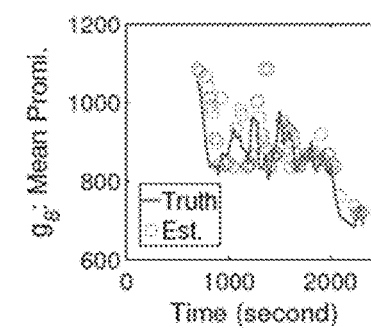
Figure 13I:
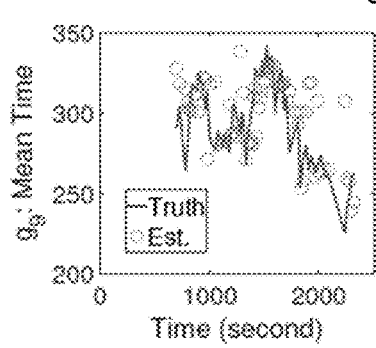
Figure 13J:
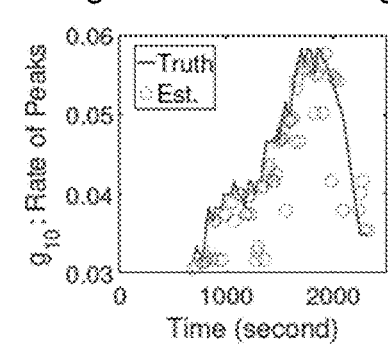
Figure 14A:
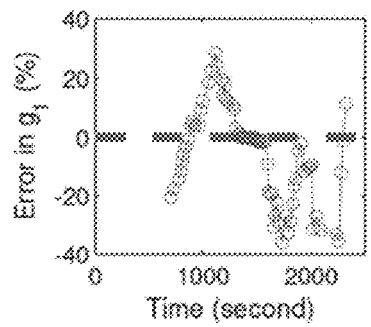
FIGS. 14a-14j are plots illustrating that an averaged error rate when estimating the features of engine RPM based on those of battery voltage according to some embodiments of the present technology.
Figure 14B:
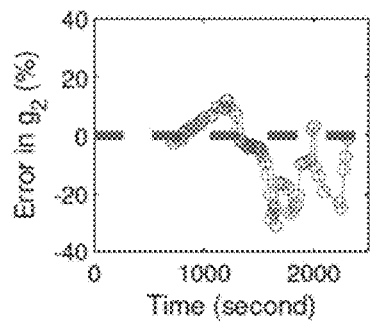
Figure 14C:
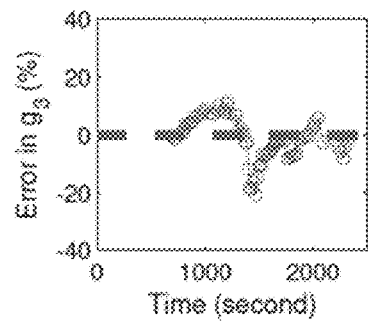
Figure 14D:
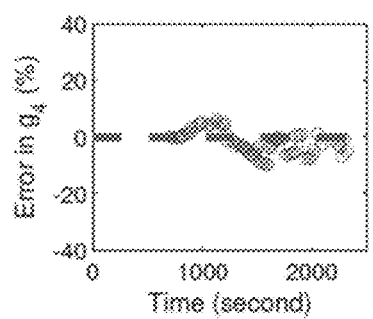
Figure 14E:
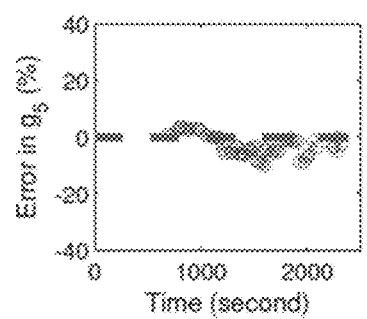
Figure 14F:
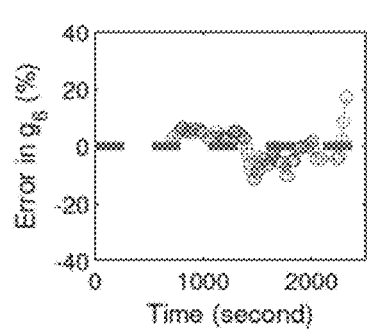
Figure 14G:
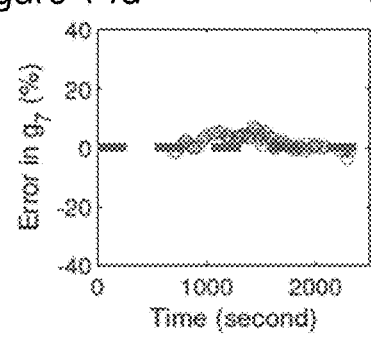
Figure 14H:
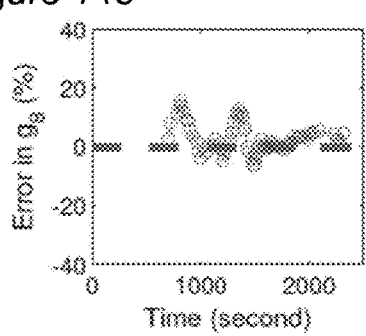
Figure 14I:
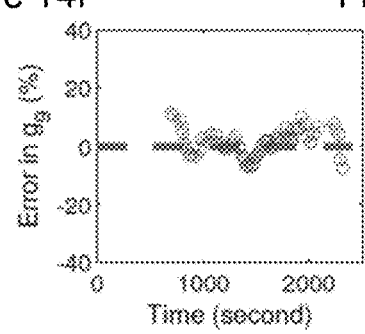
Figure 14J:
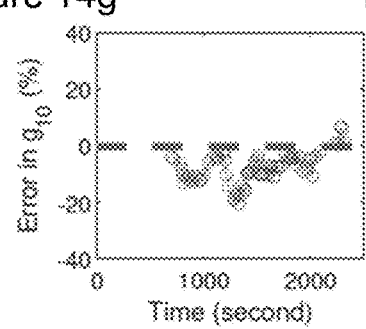

FIG. 12 illustrates RPM peak detection by B-Diag in accordance with some embodiments of the present invention. B-Diag fetches the two time-series of battery voltage and engine RPM within the above-constructed time window, and then identifies the peaks therein. B-Diag describes each peak by its peak value v, width w, prominence p, and time-stamp t, as illustrated in FIG. 12 (e.g., peak={v, w, p, t}). B-Diag stores the peaks in the current time window to facilitate identification of peaks in the next window, exploiting peak overlapping. Also, B-Diag discards the 10% of peaks (in both voltage and RPM) with the least prominence in the window, further improving its tolerance to the inherent dynamics of voltage and RPM readings. Note that neither the width nor the prominence of a peak can be determined upon its detection which is why the time window ends at the time of previous peak.

In further embodiments, B-Diag constructs an online norm model capturing the relationship between the battery voltage and engine RPM, based on the two correlations observed above. Instead of manually constructing rules that map the battery voltage to RPM, various embodiments use a machine learning-based classifier to increase the accuracy of B-Diag's mapping. Specifically, B-Diag abstracts each of the two sub-traces of battery voltage and RPM in the time window to a feature vector consisting of 10 parameters, i.e., $F=\{f_1, f_2, \ldots f_{10}\}$ for battery voltage and $G=\{g_1, g_2, \ldots g_{10}\}$ for engine RPM, and constructs a norm model that estimates Gs based on Fs. It should be appreciated that the construction of the feature vectors is not limited to RPM and that other vehicle or machine metrics may be used to construct one or more feature vectors. In other embodiments, B-Diag may forgo norm model construction if the norm models for machine or vehicle to which B-Diag has be installed if the norm models for the specific type of vehicle come pre-loaded onto the B-Diag before the commencement of operation. For example, a car with known operating parameters may have norm models pre-installed into the car before the car begins operation.

B-Diag forms its feature vectors of Fs and Gs based on the two correlations observed. First, B-Diag defines $f_6$-$f_{10}$ and $g_6$-$g_{10}$ based on the weakly correlated raw readings of voltage and RPM, or another performance metric, thus enabling B-Diag to detect non-standard readings in the RPM or other performance metric. B-Diag also defines $f_6$-$f_{10}$ and $g_6$-$g_{10}$ with the strongly correlated peaks of voltage and RPM or another performance metric, allowing B-Diag to detect unusual dynamics. The weakly correlated raw readings of battery voltage and RPM or other metrics indicate the feasibility to infer the RPM or other metric based on battery voltage. However, the accuracy of such an estimations may be limited in certain circumstances.

As a mitigation, B-Diag uses the collected statistics, instead of the raw values, of voltage/RPM readings or other readings such as speed that correlate with voltage, to form the first part of its feature vectors. Specifically, for each time window, B-Diag uses the 10%, 25%, 50%, 75%, and 90% percentiles of the voltage readings and the RPM readings or other readings as $f_1$-$f_5$ for F and $g_1$-$g_5$ for G, respectively. B-Diag forms the second part of its feature vectors based on the strongly correlated peaks of voltage and RPM. Specifically, for each time window, B-Diag uses the mean of the voltage/RPM peaks' value as $f_6/g_6$, width as $f_7/g_7$, prominence as $f_8/g_8$, relative time stamp as $f_9/g_9$, and the ratio of their counts over the window size as $f_{10}/g_{10}$. The relative time stamp of a peak is defined as its relative position in the current time window, (e.g., $t_r=t^*(t_{pre}-T_w)$) where t is the peak's time-stamp. Also, B-Diag defines $f_{10}$ and $g_{10}$ as the normalized peak counts to the window size or in other words, the rate at which peaks are observed, to reduce its dependency to the particular setting of window size.

This way, by constructing two feature vectors for each time window, B-Diag transforms the two time-series of battery voltage and engine RPM into another two time-series of their corresponding feature vectors, $\mathbb{F}=\{F^1, F^2, F^3, \ldots\}$ for battery voltage and for $\mathbb{G}=\{G^1, G^2, G^3, \ldots\}$ engine RPM. In other embodiments, the feature vectors constructed by B-Diag may be constructed from vehicle or machine metrics that are different than RPM yet are correlated with battery voltage. For instance, B-Diag may construct feature vectors between battery voltage and alternator rotation.

In certain embodiments, B-Diag uses machine learning-based classifiers to construct a norm model $\mathbb{F}$ that maps from to $\mathbb{G}$. Various embodiments may use a decision tree as the classifier because of a decision tree's simplicity and high interpretability. Again, taking the traces in FIG. 6 as an example and with a 10-minute time window, FIGS. 13a-13j plot the results when estimating $\mathbb{G}$, or more specifically the $g_i$s in each of the feature vectors $G \in \mathbb{G}$ based on feature vector $\mathbb{F}$.

FIGS. 14a-14j summarize the estimation errors normalized to the corresponding true values also referred to as error ratios. The estimation errors are clustered around 0 and thus accurate (e.g., the mean errors when estimating $g_1$-$g_{10}$ are within 0.8% to 11%); However, the variance is observed in both the estimation errors of individual $g_i$s and across different $g_i$s, thus requiring further mitigation when grounding B-Diag's anomaly detection on these errors.

In further embodiments, B-Daig is configured to detect anomalies. For the i-th time window (and the corresponding feature vectors $F^i$ and $G^i$), B-Diag trains a tree-based model based on the previous feature vectors (i.e., $F^1$ to $F^{i-1}$ and $G^i$ to $G^{i-1}$), and then uses the trained model to estimate $G^i$ based on $F^i$ where an anomaly in RPM is detected if the empirically collected $G^i=\{g_j^i\}$ deviates significantly from the model estimated $\hat{G}^i=\{\hat{g}_j^i\}$ (j=1, 2, 3, ..., 10) Specifically, B-Diag defines the error of estimating $G^i$ as:

$$e_i = \|G^i - \hat{G}^i\| = \sum_{j=1}^{10} \sqrt{(\hat{g}_j^i - g_j^i)^2} / g_j^i \times 100\%$$

Such a summation of individual estimation errors of $g_j$s suppresses their relatively large variance as observed in FIGS. 14a-14j.

Figure 15A:
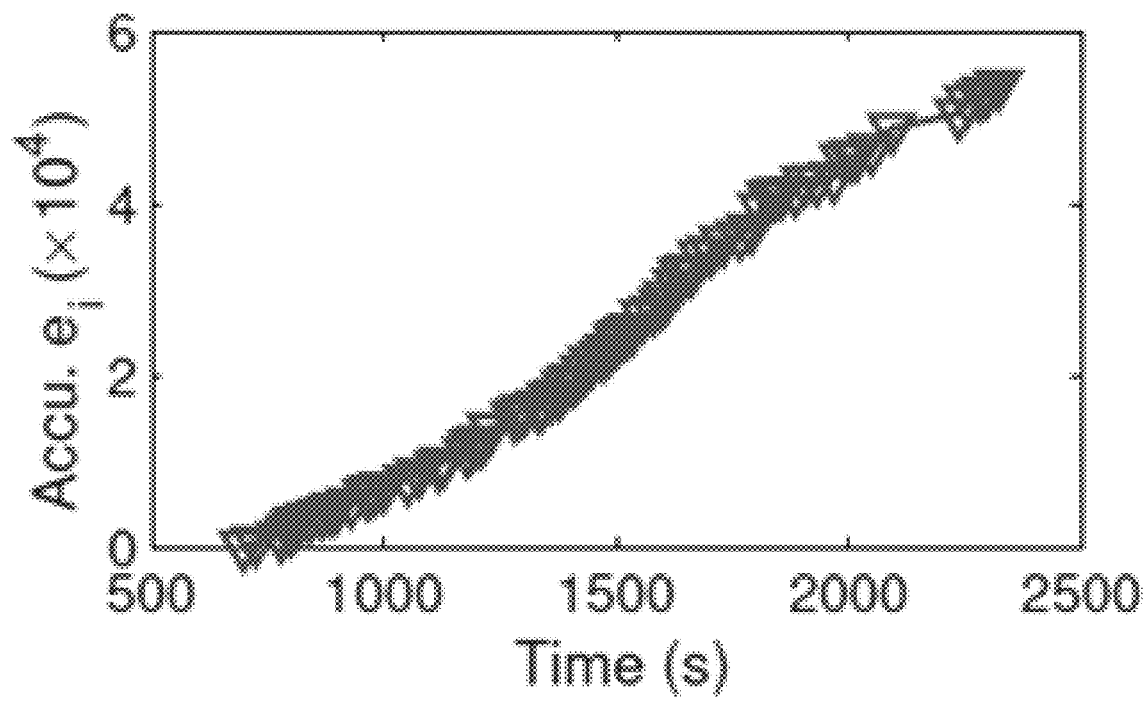
FIGS. 15a-15b are plots illustrating the linear accumulation of $e_i$s according to some embodiments of the present technology.
Figure 15B:
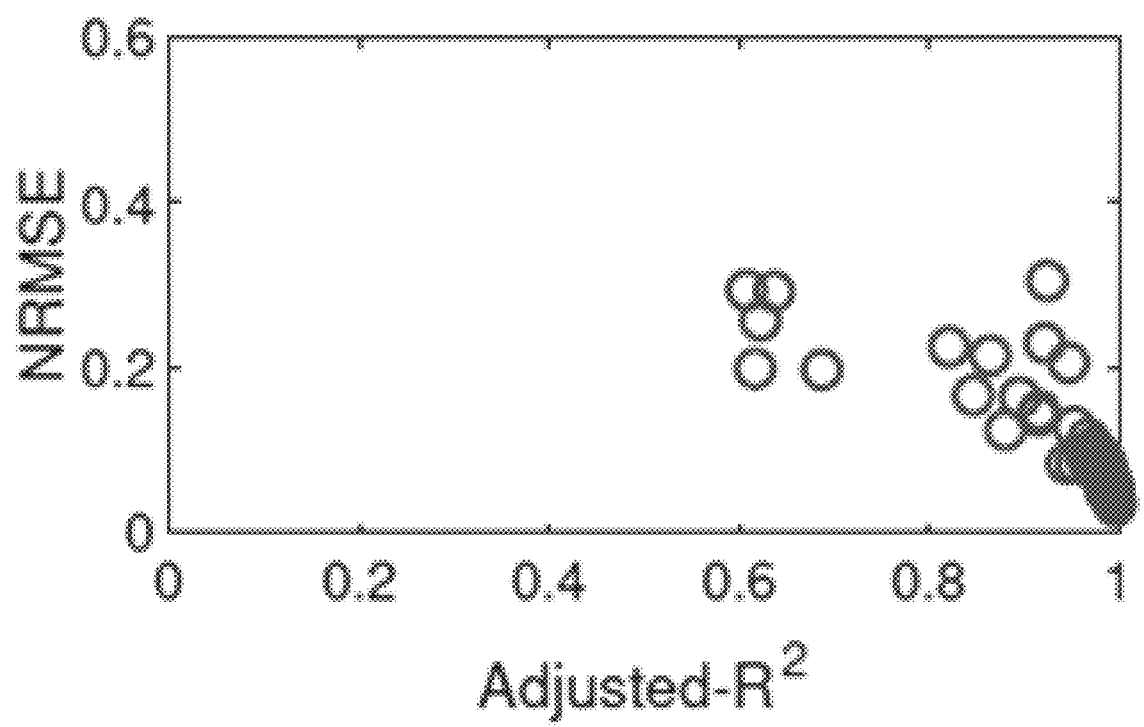

To collaborate this, FIG. 15a plots the accumulated $e_i$s obtained with the traces shown in FIG. 6, which increases steadily and linearly. FIG. 15(b) plots the goodness-of-fit when fitting the accumulated $e_i$s linearly for each of the 64 traces summarized in FIG. 4e. The fact that all the fitting results are clustered at the right-bottom corner of the figure with an adjusted-$R^2$ that is close to 1 and NRMSE that is close to 0, validates the high fitting goodness and thus the linearity of accumulated $e_i$s.

This linearity of accumulated $e_i$s allows B-Diag to describe it as a linear regression model. A linear parameter identification problem is thus formulated as:

$$E_{acc}[i]=S[i]^*t[i]+\delta[i]$$

where for the i-th time window ending at time t[i], $E_{acc}[i]$ is the accumulated $e_i$s, S[i] is the regression parameter, and $\delta[i]$ is the identification error. The regression parameter S represents the slope of the linear model and thus the averaged $e_i$ over time. The identification error $\delta$ represents the residual which in some instances, is not explained by the model. In certain embodiments, B-Diag uses the recursive least squares (RLS) techniques to solve such a linear regression. Also, the reliable linear model of accumulated $e_i$s indicates the corresponding identification error $\delta$s should be small and stable in the normal cases, motivating B-Diag to make its decision on anomaly detection based on $\delta$s. Specifically, B-Diag defines $$\tau_i=|\delta_i-\mu(\delta_1:\delta_{i-1})|/\sigma(\delta_1:\delta_{i-1})$$

where $\tau_i$ is the deviation of $\delta_i$ from the mean of $\{\delta_1, \delta_2, \ldots, \delta_{i-1}\}$ in terms of their standard deviation, and concludes an anomaly in RPM is detected if $\tau_i>\theta$. For the purposes of explanation, various embodiments may set $\theta=5$ by default however depending on the implementation, $\theta$ may vary.

Figure 16A:
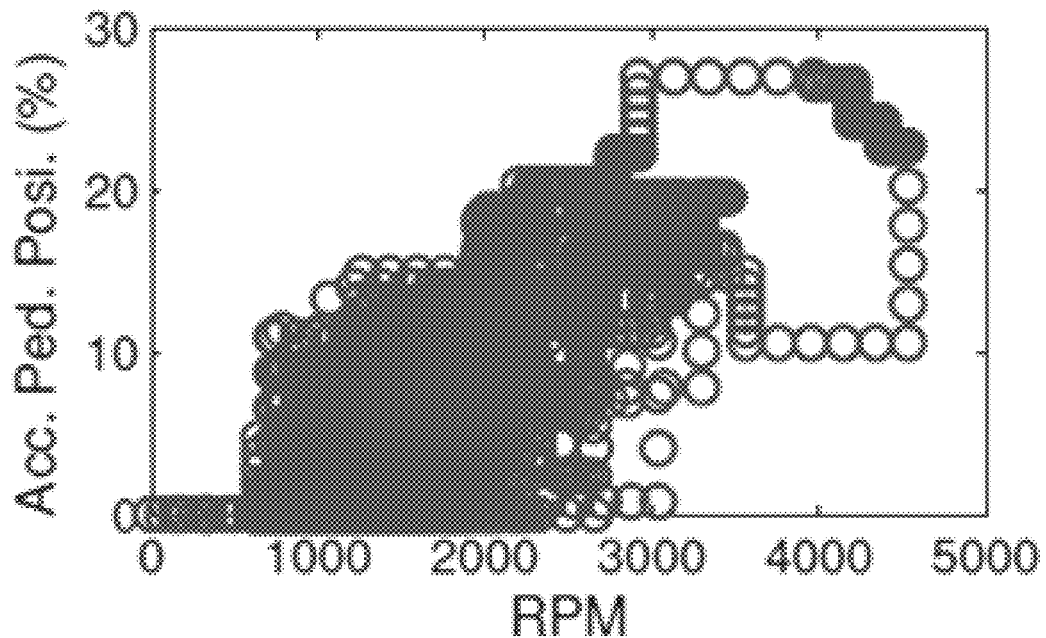
FIGS. 16a-16b are plots illustrating anomaly verification in accordance with some embodiments of the present technology.
Figure 16B:
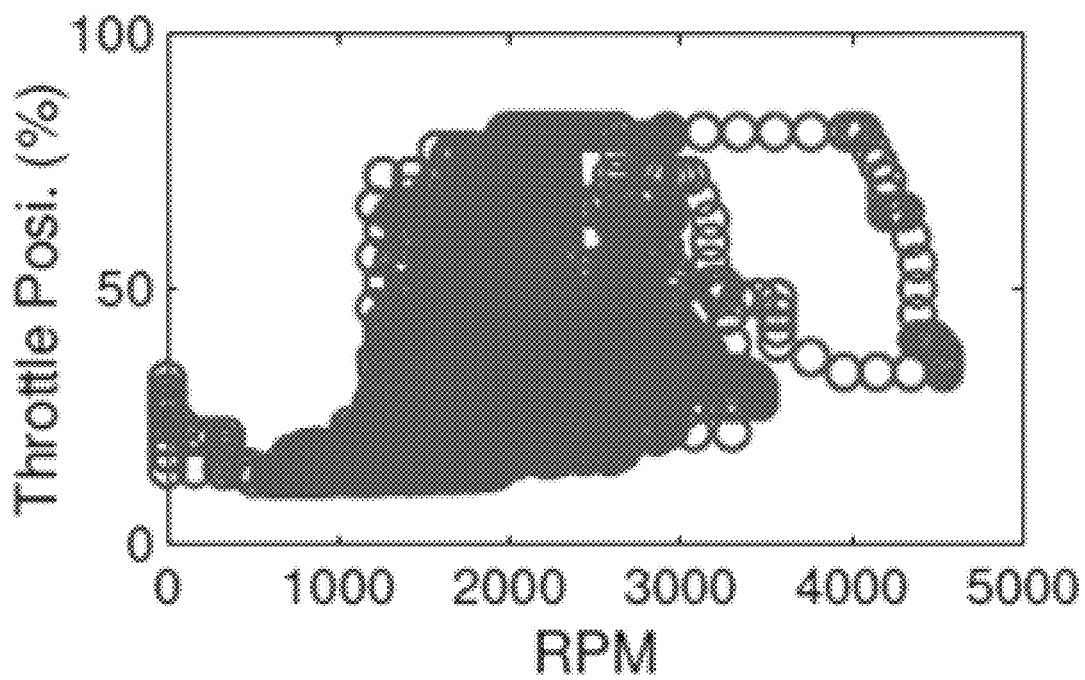

Various embodiments of B-Diag will further verify the detected anomalies by exploiting the fact that engine RPM, besides correlating strongly with the battery voltage, also correlates with other vehicle parameters. For example, the physically induced correlations between RPM and the accelerator pedal position and throttle position have been identified, as shown in FIGS. 16a-16b. Various embodiments of B-Diag may exploit these non-battery correlations with RPM to verify the above-detected RPM. Abnormal RPM readings can cause abnormal behavior with regard to the battery voltage but can also cause abnormal behaviors with regard to other correlated vehicle parameters. B-Diagconducts such an anomaly verification, again, via norm model construction and then checking, with similar approaches explained above. B-Diag will confirm the detected RPM anomalies if abnormal behaviors between RPM and any of these correlated vehicle parameters are detected.

Figure 17:
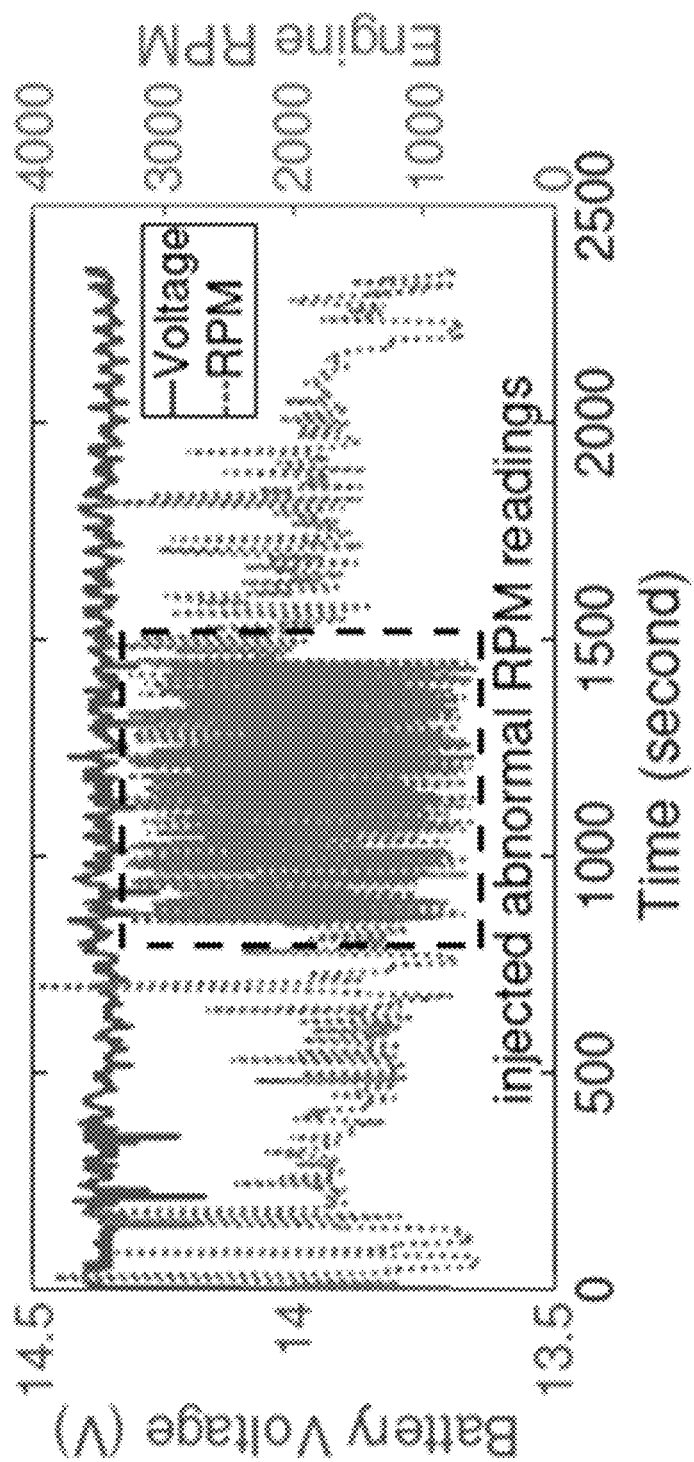
FIG. 17 is a plot showing the effect of adding anomalies to the genuine RPM readings according to some embodiments of the present technology.
Figure 18A:
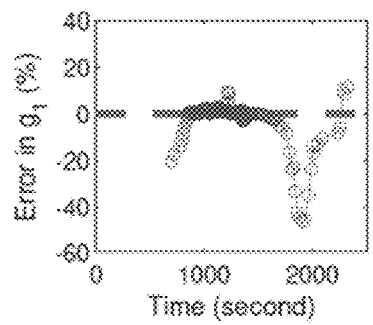
FIGS. 18a-18j are plots showing error magnification when abnormal RPMs are injected according to some embodiments of the present technology.
Figure 18B:
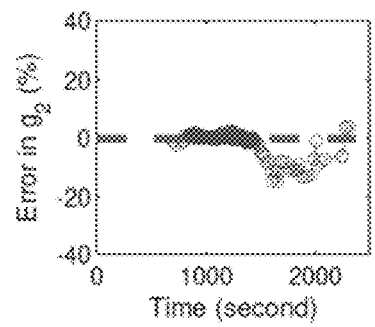
Figure 18C:
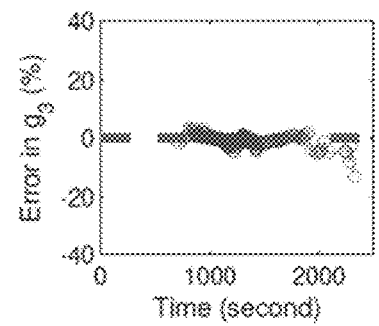
Figure 18D:
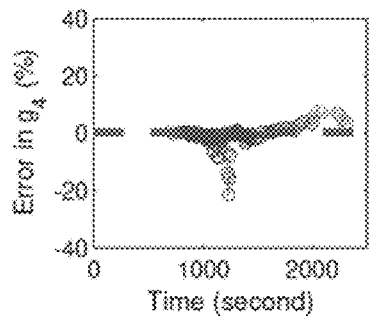
Figure 18E:
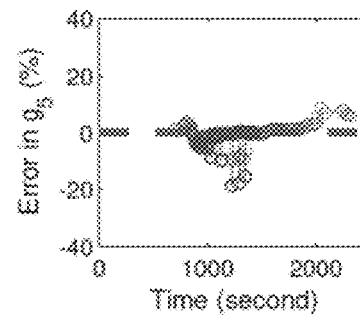
Figure 18F:
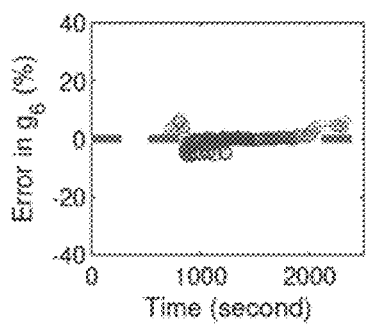
Figure 18G:
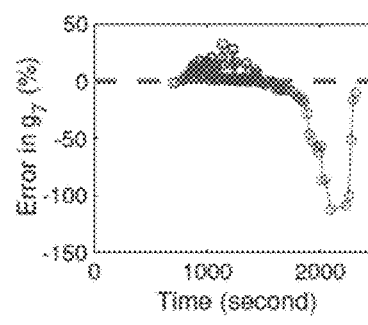
Figure 18H:
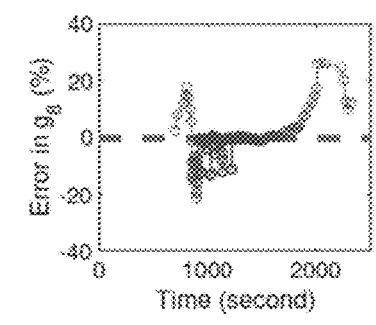
Figure 18I:
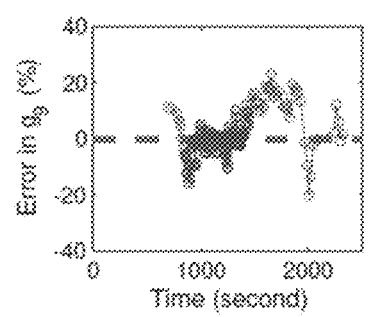
Figure 18J:
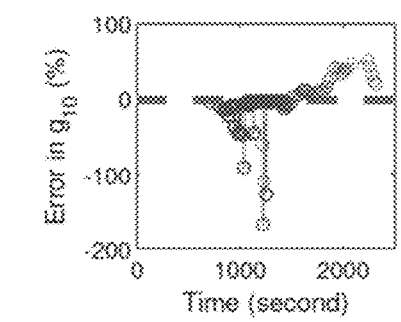

Next, an example according to one or more embodiments of the present technology illustrates exemplary anomaly detection by B-Diag. B-Diag detects and then verifies anomalies in engine RPM based on the battery voltage. Specifically, RPM anomalies are emulated by injecting randomly fabricated RPM readings into the traces in FIG. 6, and tests if B-Diag is able detect such anomalies. FIG. 17 plots the altered RPM trace after injecting anomalies during the time period of 849 seconds to 1449 seconds. B-Diag is then applied to the altered trace with a window size of 600 seconds, FIGS. 18a-18j plot the errors when estimating RPM's feature parameters based on those of the battery voltage, showing degraded accuracy at $\{g_5, g_7, g_8, g_9, g_{10}\}$ when compared to FIGS. 14a-14j.

Figure 19:
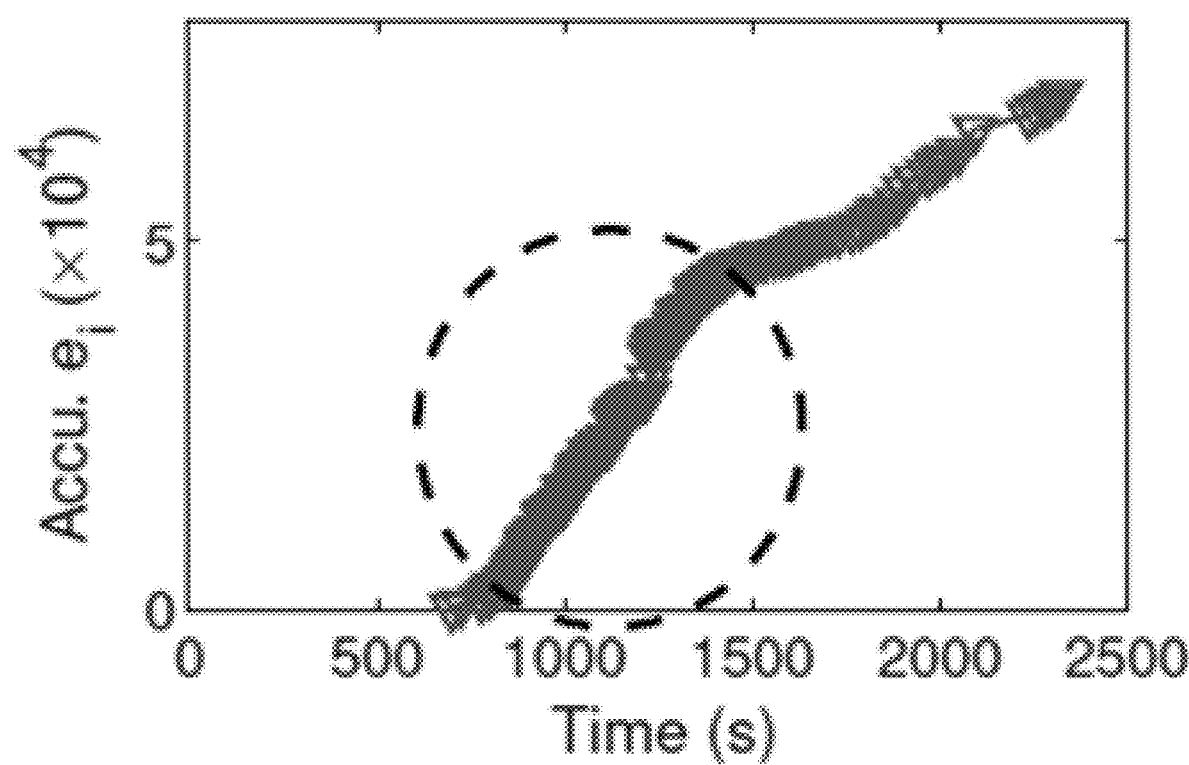
FIG. 19 is a plot showing how the abnormal RPMs change the slope of the accumulated $e_i$s in accordance with some embodiments of the present technology.
Figure 20:
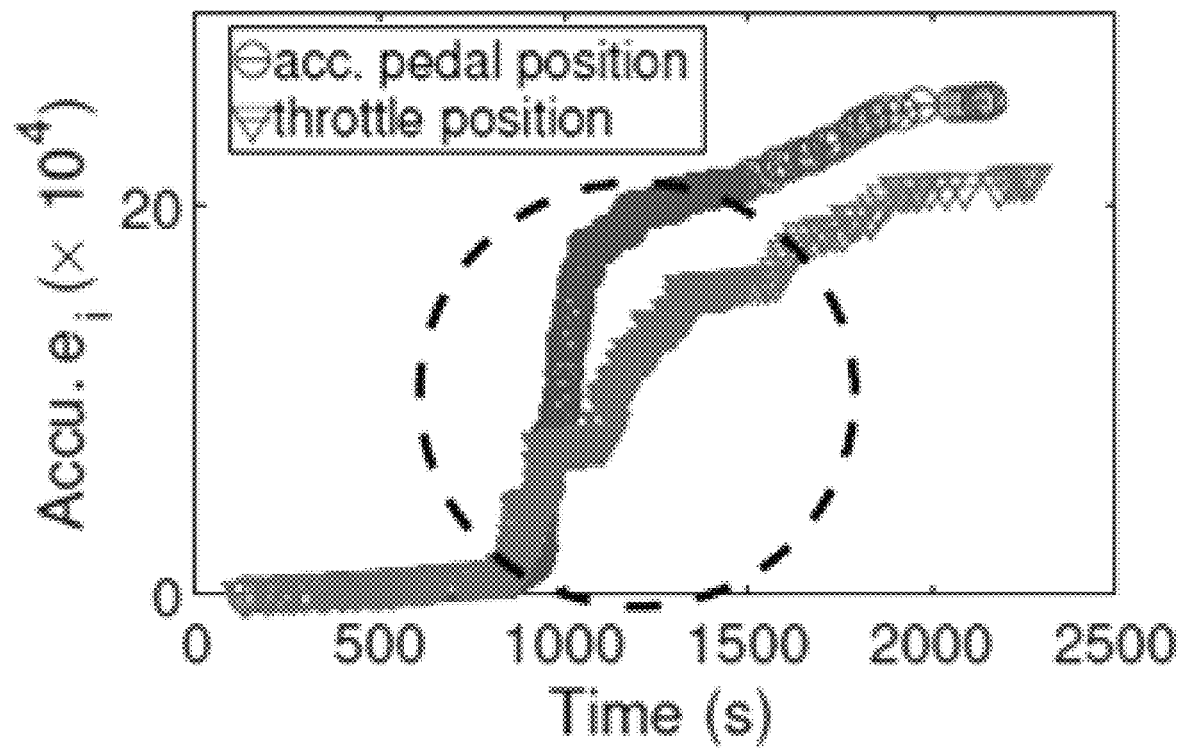
FIG. 20 is a plot showing how the abnormal RPMs change the slopes of the accumulated $e_i$s in accordance with some embodiments of the present technology.

FIG. 19 plots the accumulated estimation errors showing the injected anomalies change the slope of the accumulated $e_i$s, and thus being detectable. Note that no anomaly is detected when applying B-Diag to the raw traces in FIG. 6, and thus no false detection is caused. The detected RPM anomalies can be further verified by cross-validating with the accelerator pedal position and throttle position, which are confirmed with the clearly changed slopes of accumulated $e_i$s (see FIG. 20).

Some embodiments use the detection of RPM anomalies with battery voltage as a case-study to walk through B-Diag's cyber-physical approach of vehicle diagnostics. Besides the engine, physical dependencies with the automotive battery also exists at other vehicle modules, thus offering opportunities to generalize B-Diag's anomaly detection to any other vehicle or machine parameter that is correlated, either directly or indirectly, with battery voltage.

Figure 21:
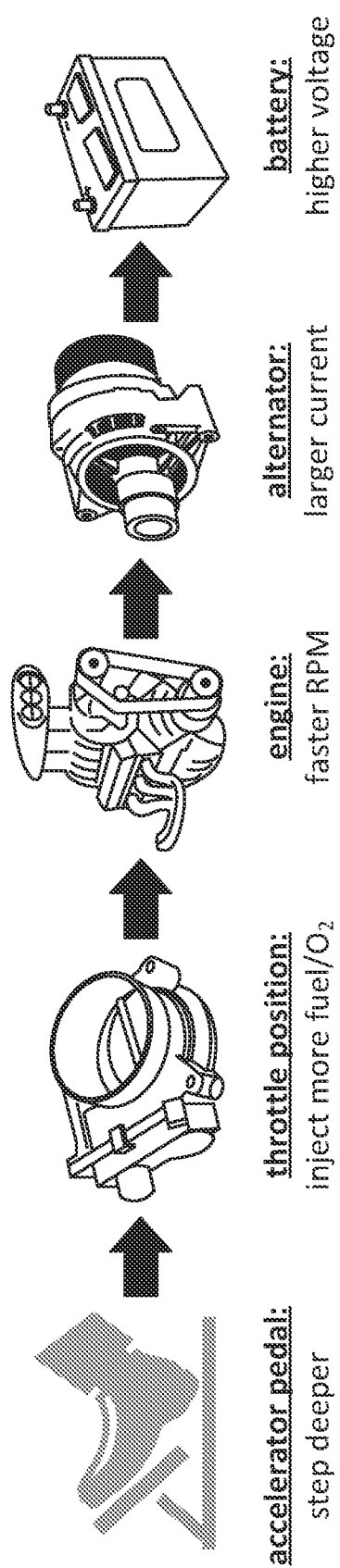
FIG. 21 is a block diagram illustrating physically induced correlations in vehicular systems in accordance with one or more embodiments of the present technology.

Specifically, examining the physical inter-connection among vehicle's sub-systems, FIG. 21 shows a dependency diagram among vehicle's accelerator pedal, throttle, engine, alternator, and battery. Steered by this dependency diagram, the related vehicle information collected when driving the Crosstrek® was further checked and confirmed the correlations with the battery voltage at the information listed in Table 1.

Figure 22:
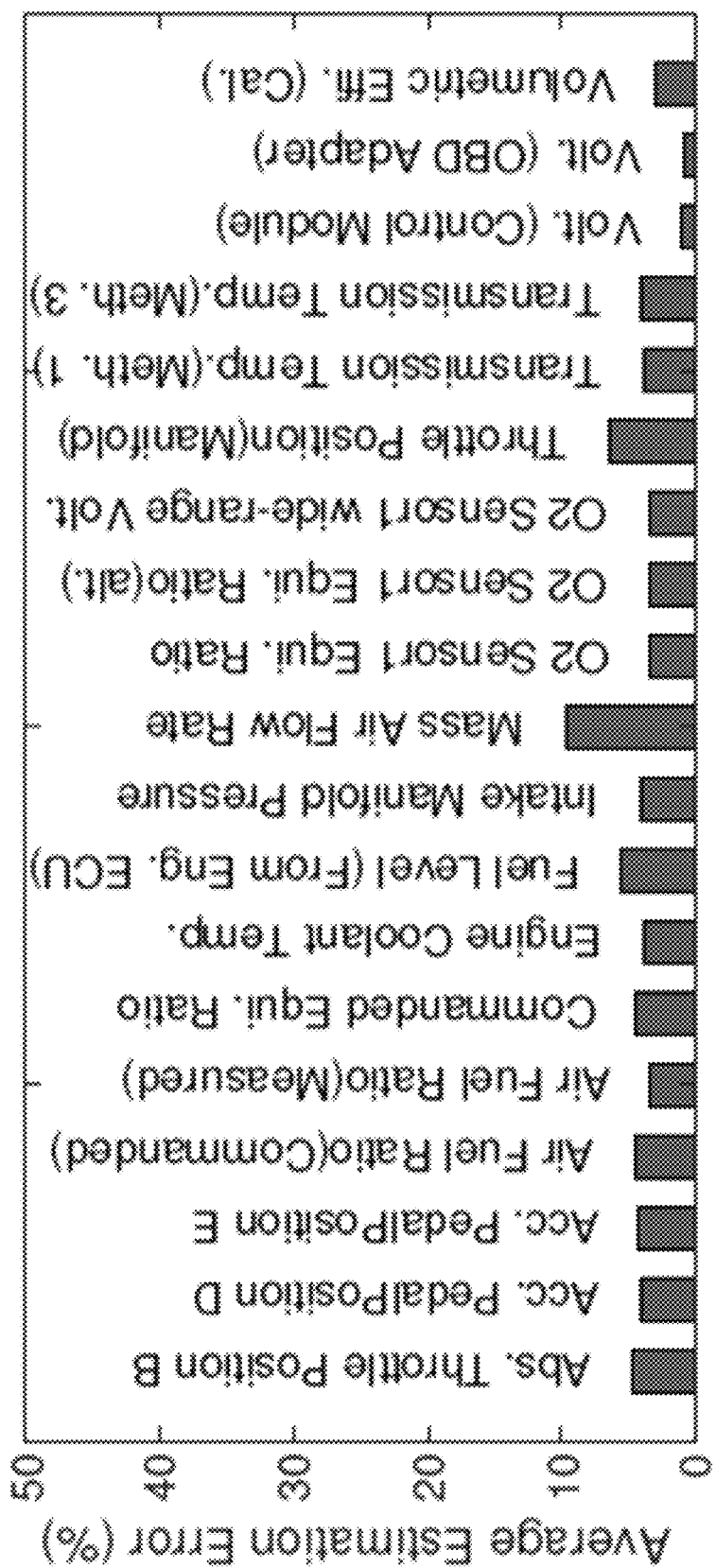
FIG. 22 is a histogram illustrating the errors in estimating feature vectors in vehicle systems according to some embodiments of the present technology.

As an example, FIG. 22 plots the averaged error when estimating the vehicle information listed in Table 1 (besides those relate to engine RPM), or more specifically their feature vectors, based on the traces collected during the same trip as with FIG. 6 with similar approaches discussed above, showing averaged errors within 0.9% to 9.7%. Note that FIG. 21 may, in certain circumstances, not be thorough in capturing the physical dependency among vehicle's sub-systems and thus Table 1 may not be exclusive. These multi-modal correlations between battery voltage and other vehicle information enable B-Diag to act as a comprehensive diagnostic system for vehicles, machines, or other devices that produce outputs that are correlated to changes in battery voltage.

To facilitate the systematic exploitation of these physically-induced correlations for vehicle diagnostics, B-Diag abstracts the vehicle with a 2-layer correlation graph $\mathbb{G}_{corr}=\{V,E\}$, in which the vertex set V represents the operational parameters of the vehicle with the battery voltage at the upper layer and other vehicle parameters at the lower layer. The edge set E captures the correlations among vehicle parameters where an edge $e_{i,j}$ connecting vertex $v_i$ and $v_j$ exists in E if $v_i$ and $v_j$ are correlated.

Figure 23:
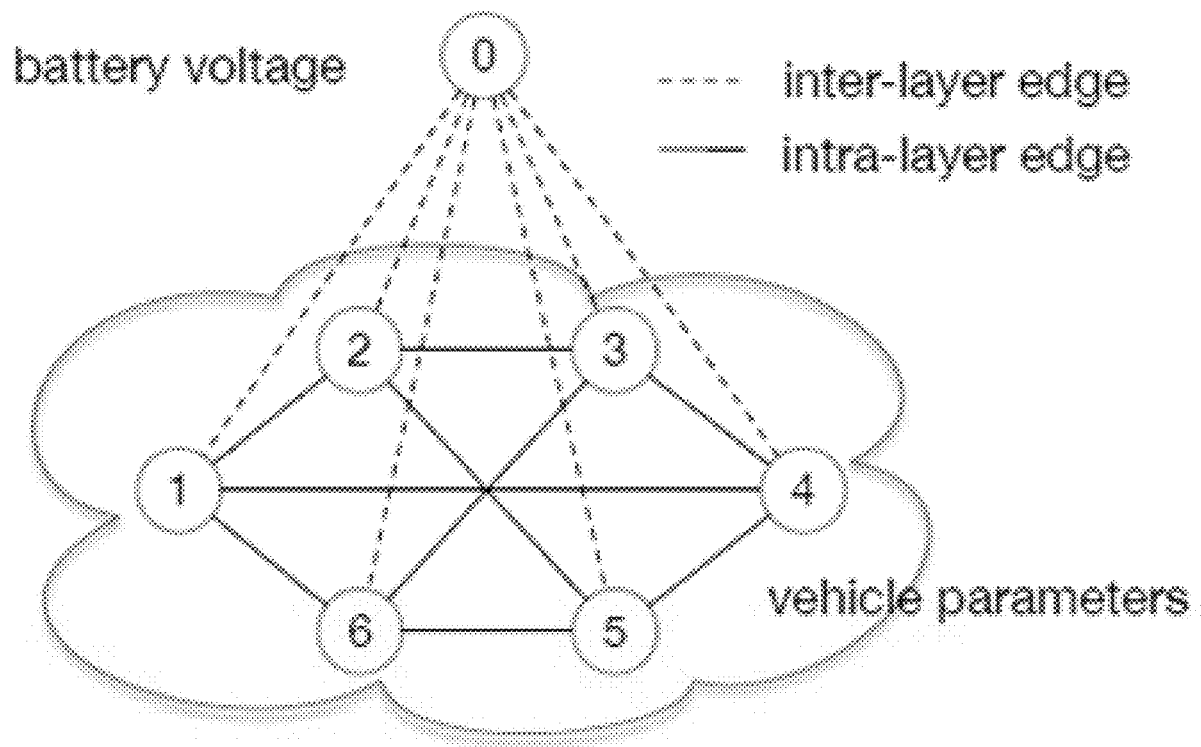
FIG. 23 illustrates how various vehicle systems interactions with voltage and with each other in accordance with some embodiments of the present technology.

FIG. 23 shows an exemplary correlation graph. The 2-layer structure of the correlation graph is to capture the uniqueness of the automotive batteries in vehicles. Battery voltage can be directly (and easily) collected from the battery without going through the in-vehicle network, thus being tolerable to the risks of cyber-induced anomalies thereof and serving as a trustworthy ground for B-Diag's diagnostics of vehicles. Additionally, the battery draws power from the alternator and supplies power to the vehicle's electrical systems, implying strong correlations between battery voltage and many vehicle parameters. As a result, the correlation graph consists of two types of edges: the inter-layer edges representing the correlations between battery voltage and other vehicle parameters, and the intra-layer edges capturing the pairwise correlations between vehicle parameters besides battery voltage. Note the correlation graph also defines B-Diag's ability of diagnosing vehicles and which vehicle modules/parameters B-Diag can protect.

With such an abstracted correlation graph $\mathbb{G}_{corr}$, B-Diag's detection and verification of anomalies at each vehicle parameter is transformed to the construction (and then checking) of the data-driven norm model(s) defined by the corresponding inter/intra-layer edges. B-Diag takes a round-robin approach to check the individual inter-layer edges of $\mathbb{G}_{corr}$ for anomaly detection: substituting the engine RPM with the target vehicle information and detecting and verifying the anomalies thereof with similar approaches.

Various embodiments of the B-Diag were evaluated with four vehicles, those being a 2018 Subaru Crosstrek®, a 2008 Honda Fit®, a 2018 Volvo XC60®, and a 2017 Volkswagen Passat®. The major challenge in B-Diag's evaluation is the deficient cases/traces of vehicle anomalies, which can be addressed with two mitigations: evaluating B-Diag with anomalies caused by an unreliable OBD-II adapter and emulated anomalies by injecting fabricated values to normal vehicle traces. B-Diag was first evaluated with empirically collected abnormal vehicle data.

Figure 24:
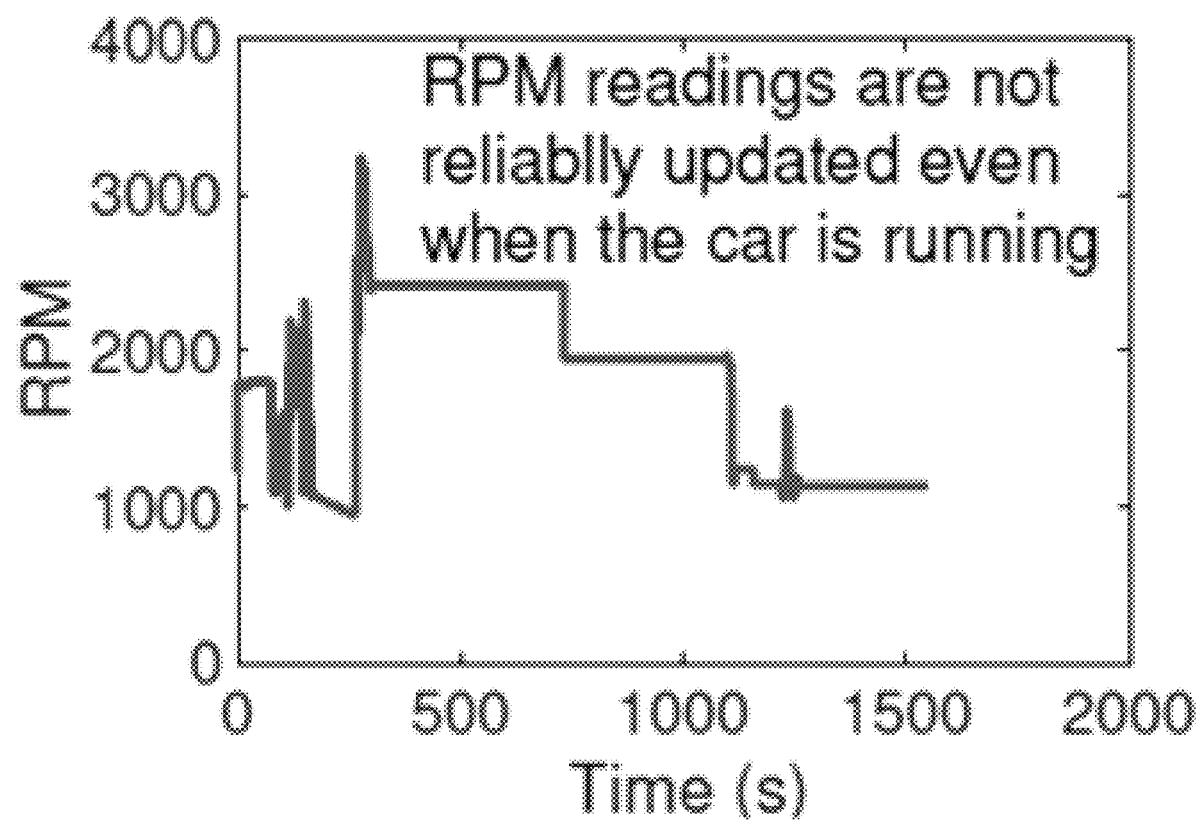
FIG. 24 is a plot illustrating data distortion from faulty vehicle components according to some embodiments of the present technology.

One faulty Bluetooth OBD-II adapter was identified that was unreliable in collecting the vehicle information, as plotted in FIG. 24 with the engine RPM as an example. The RPM keeps constant for up to over 10 minutes when driving the Crosstrek® in urban road with frequent acceleration and braking. The unreliability of this adapter was further verified with different vehicles. The abnormal vehicle information collected with this faulty adapter serves as a promising candidate to evaluate B-Diag's ability in detecting the anomalies thereof, even though these anomalies are caused due to the faults of the OBD-II adapter and not the vehicle. For example, the deficient updates of engine RPM in FIG. 24 could map to the case that the vehicle's tachometer is faulty or hacked.

Figure 25:
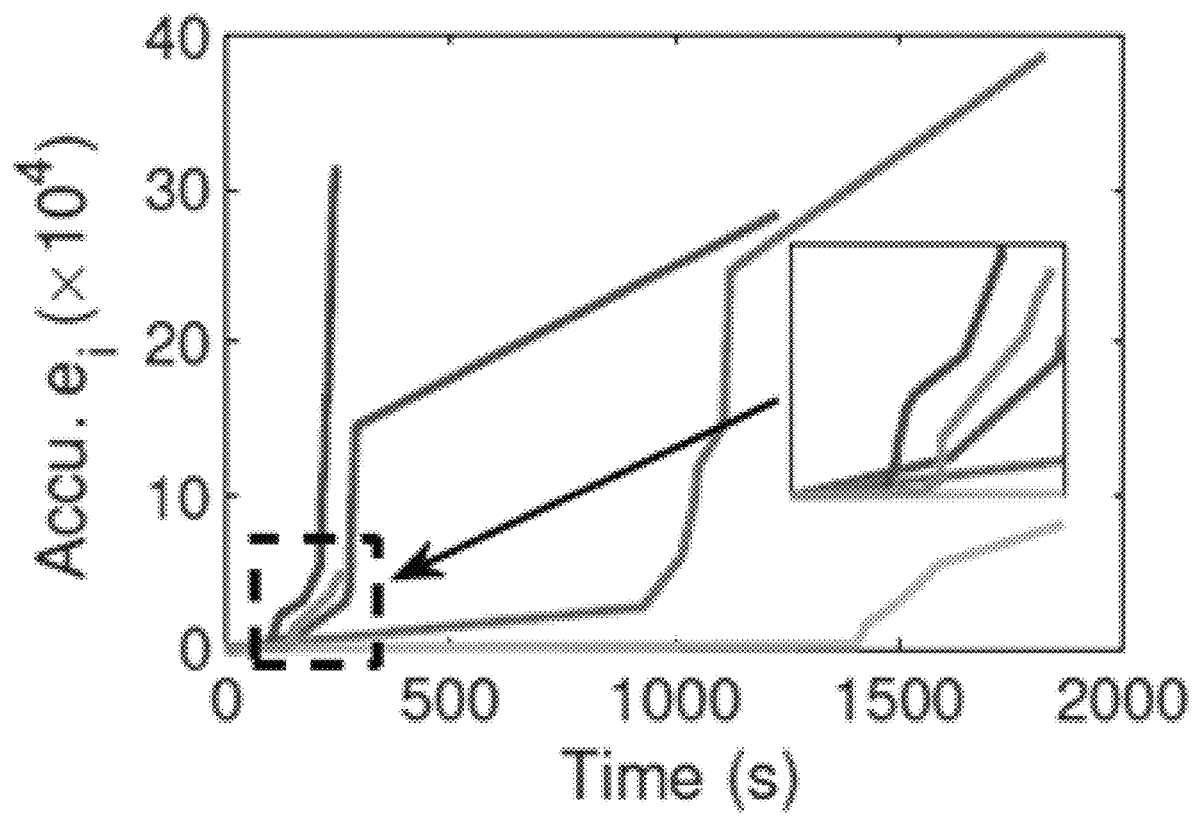
FIG. 25 is a plot illustrating the accumulated $e_i$s of engine RPM under abnormal conditions according to some embodiments of the present technology.

During the tests, 5 abnormal vehicle traces were collected with the Subaru Crosstrek® using this defective adapter, each lasting about 25, 41, 33, 6, and 6 minutes. B-Diag was then applied with a moving window of 60 s to these traces, to detect the anomalies in the vehicle information listed in Table 1. B-Diag successfully detected the anomalies in all these vehicle operating parameter in all 5 of the traces. As an example, FIG. 25 plots the accumulated $e_i$s of the engine RPM of these abnormal traces: the abrupt changes in slopes validate the detectability of anomalies thereof by B-Diag.

In some embodiments, B-Diag differentiates between anomalies caused faults in the data collection techniques of B-Diag and anomalies caused by vehicle system failures. Differentiation in this manner is possible because the faults of data collection will cause anomalies in all the collected vehicle system information, while the actual vehicle failures will, unless in a rare case where most of the vehicle modules fail, cause anomalies only in the vehicle information related to the faulty vehicle modules. The risk of these adapter-caused anomalies can be reduced by employing reliable OBD-II adapters, such as using the wired OBD-II adapters to collect the vehicle information instead of those based on Bluetooth. As such, some embodiments of B-Diag were evaluated against emulated anomalies in the vehicle information.

In some embodiments, B-Diag was further tested by emulating anomalies of engine RPM based on the wheel's RPM empirically collected during the same driving trip. Wheel RPM quantifies the rotation speed of the vehicle's wheels. Mechanically, $$RPM_{wheel}=\alpha_i(t)*RMP_{engine}$$

where $\alpha_i(t)$ is the gear ratio at time t, determined by the real-time driving behavior. The empirically collected wheel's RPMs are a promising candidates to emulate the anomalies of engine RPMs during the same driving trip. This is because a wheel's RPMs fall in the legal range of engine RPM (with $\alpha_i(t)=1$), making the thus-emulated anomalies possible to occur in practice and not diagnosable by existing range-based diagnostics systems. Additionally, the wheel RPM is strongly correlated to, but different from, the engine RPM, and such a correlation is dynamic over time.

Figure 26:
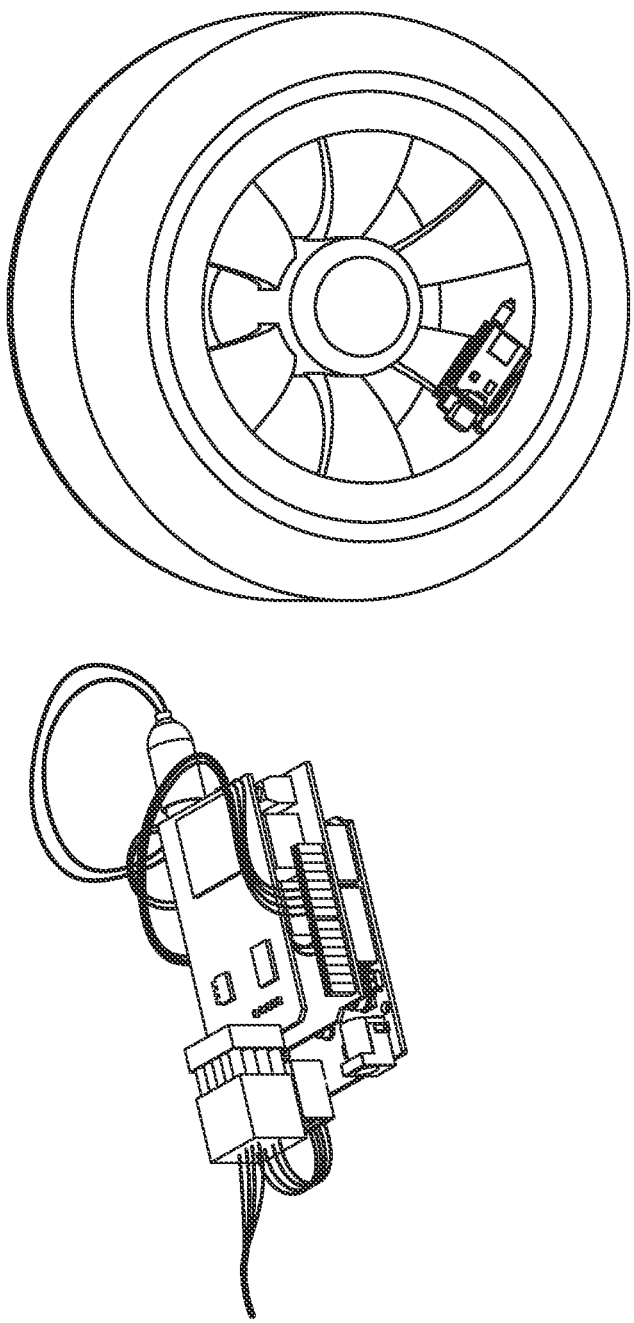
FIG. 26 is a photograph illustrating a RPM sensor and its placement on a wheel according to one or more embodiments of the present technology.
Figure 27B:
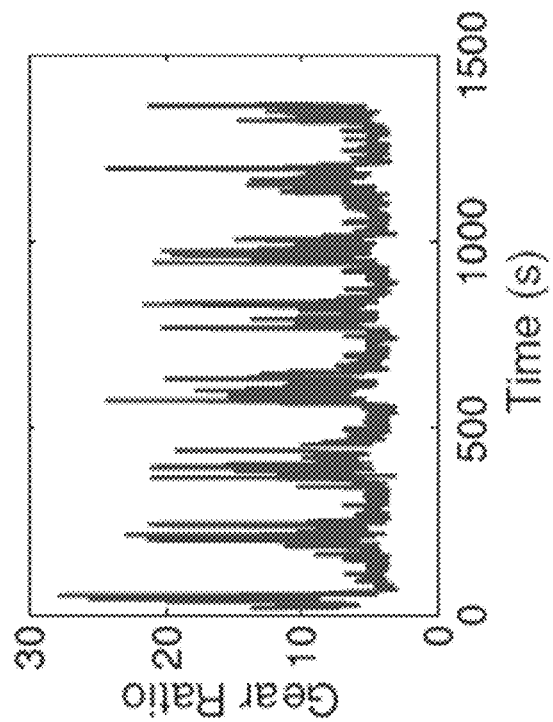
FIGS. 27a-27b are plots illustrating emulated anomalies in engine RPM and a wheel's RPM according to one or more embodiments of the present technology.
Figure 27A:
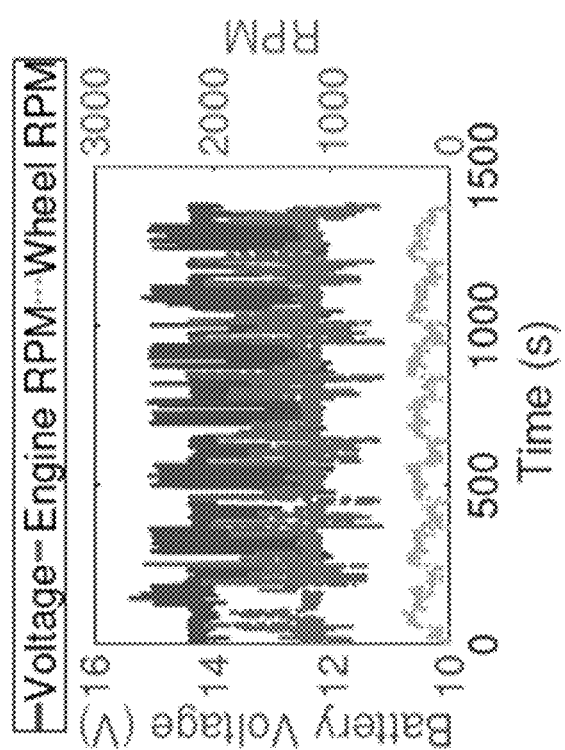
Figure 28:
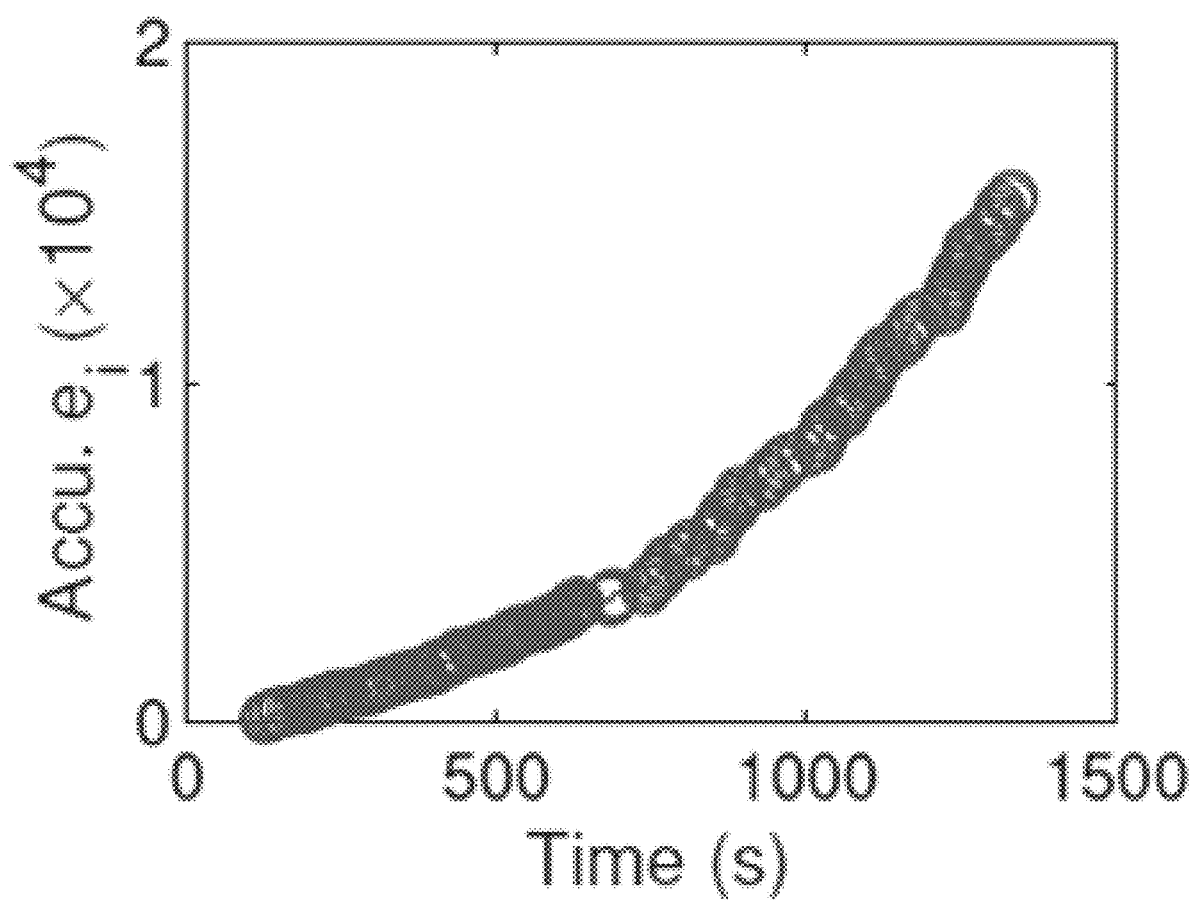
FIG. 28 is a plot illustrating accumulated $e_i$s of emulated anomalies in accordance with some embodiments of the present technology.

Inspired by this, an Arduino-based RPM sensor with a hall sensor and a magnetic was attached to the front-right wheel of the Subaru Crosstrek® as shown in FIG. 26. FIG. 27a plots the collected wheel RPM, engine RPM, and battery voltage during a 23-minute drive of the vehicle. The corresponding gear ratio during this driving is plotted in FIG. 27b. Abnormal engine RPMs were then emulated by concatenating the first 10-minute trace of engine RPM and the last 13-minute trace of wheel RPM, and were examined to determine if B-Diag was able to detect such emulated anomalies. FIG. 28 plots the accumulated $e_i$s obtained with such an emulation, whose change in slope at about the 10.5th minute, about 0.5 minute after the emulated anomalies begin, thus validating B-Diag's ability of detecting such anomalies.

In other embodiments, some vehicle anomalies were emulated by injecting fabricated vehicle information to the collected normal traces. Specially, denoting the genuine time series of the targeting vehicle output (e.g., engine RPM) as v(t), anomalies were injected to v(t) with the following two anomaly models, emulating the fabrication and masquerade attacks in practice.

Injecting anomalies after a randomly selected time $t_{anom}$ by fabricating v(t) within a legal range:

$$v'(t)=(1-\text{rand}(a))*v_{min}+\text{rand}(a)*v_{max} \text{ where } (t \geq t_{anom})$$

where $v_{min}$ and $v_{max}$ are the minimum/maximum of v(t), rand(a) returns a random value in [0, a], and $a \in [0,1]$ where rand(a) controls the levels of the fabricated readings (a=0.8 for purposes of explanation). The thus-fabricated vehicle information will still be within the minimum/maximum of its genuine levels, thus voiding existing range-based diagnostics systems. This is also how the RPM anomalies in FIG. 17 were generated.

TABLE 2

Summary of the traces collected with a 2008 Honda Fit ®, a 2018 Volvo XC60 ®, and a 2017 Volkswagen Passat ®.

| Vehicles | # of Traces | Total Duration | Total Distance |
| --- | --- | --- | --- |
| Honda Fit | 11 | 4.7 hour | ≈160 miles |
| Volvo XC60 | 17 | 4.1 hour | ≈210 miles |
| Volkswagen Passat | 7 | 29 hour | ≈1,840 miles |

Figure 29:
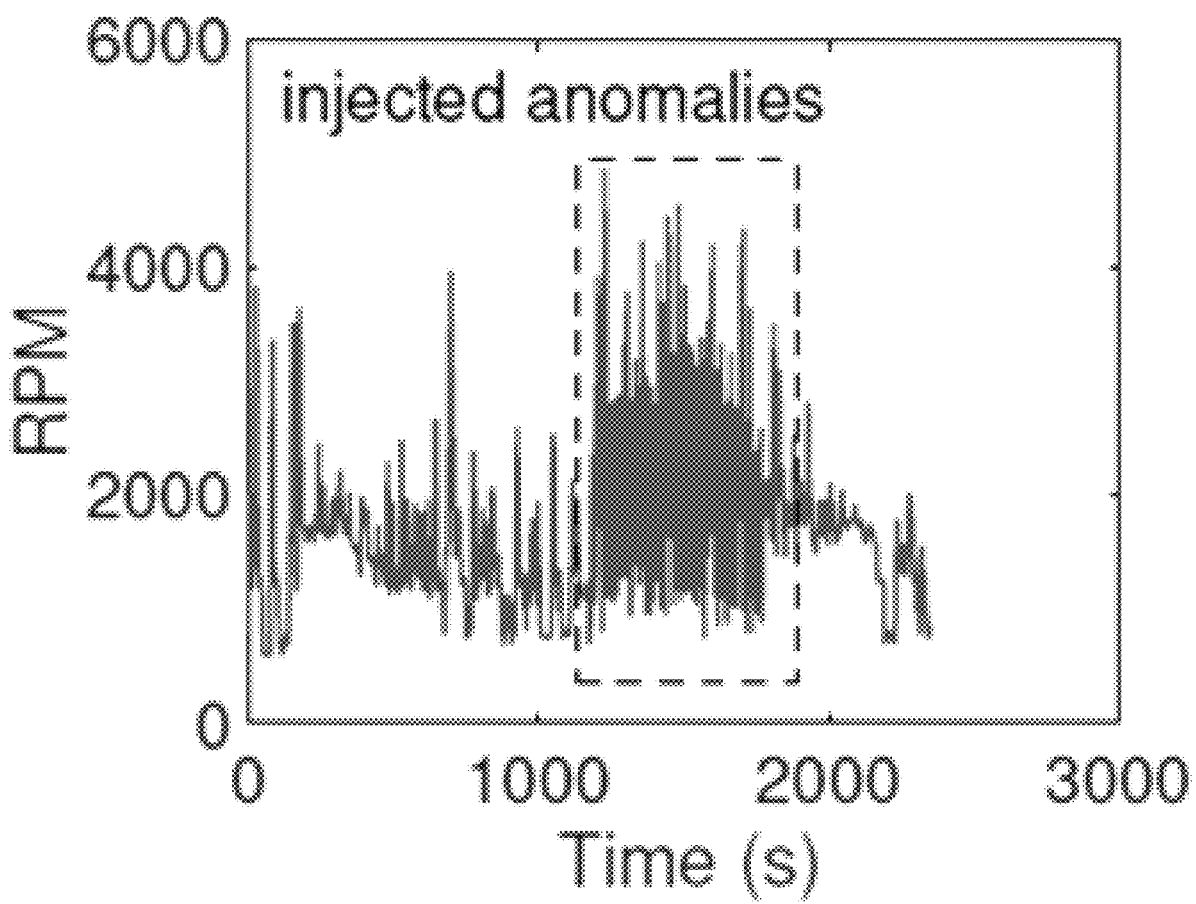
FIG. 29 is a plot illustrating an example of the injected RPM anomalies according to one or more embodiments of the present technology.

To further demonstrate the robustness of B-Diag, anomalies were injected after a randomly selected time $t_{anom}$ by shifting v(t)s from their true values randomly is given by:

$$v'(t)=(1-b+2b*\text{rand}(1))*v(t) \text{ where } (t \geq t_{anom})$$

where b controls the maximum shift of the fabricated v(t)s from their true values (b=0.5 for purposes of explanation). FIG. 29 shows an example of such generated RPM anomalies based on the genuine trace in FIG. 6.

Figure 4E:
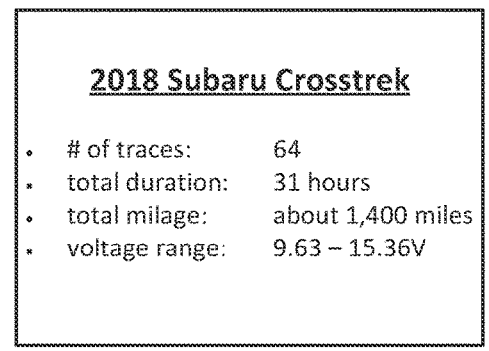

Various embodiments of B-Diag were evaluated during the 64 driving traces of the Subaru Crosstrek® summarized in FIG. 4(e), taking again, the anomalies in engine RPM as an example.

Figure 30A:
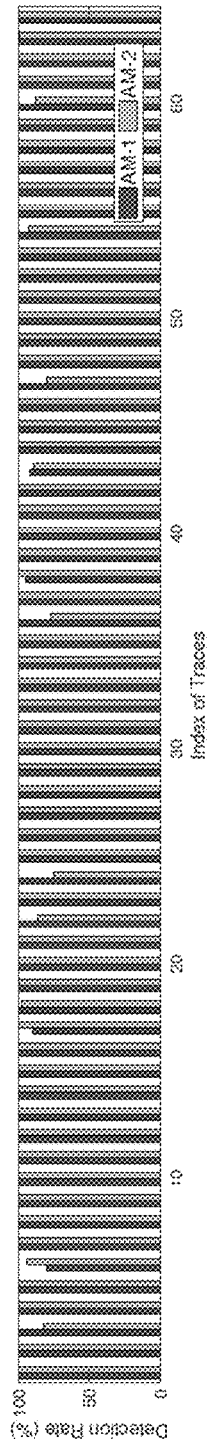
FIGS. 30a-30c plots illustrating B-Diag's error rate, detection latency, and false detection against RPM anomalies in accordance with one or more embodiments of the present technology.
Figure 30B:
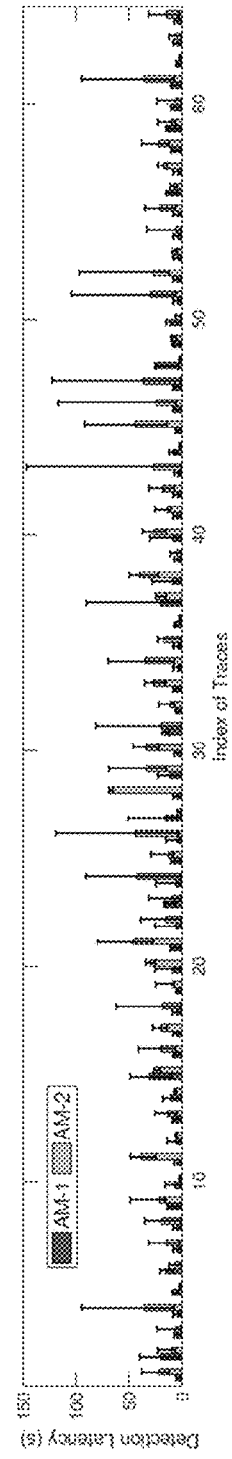
Figure 30C:
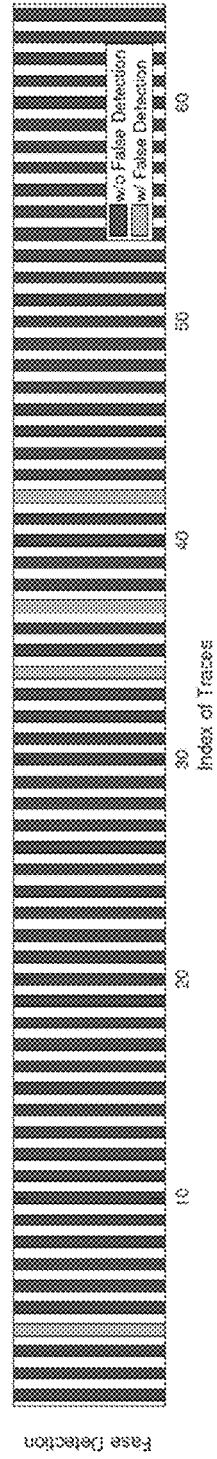

FIGS. 30a-30c summarize B-Diag's performance in anomaly detection, in terms of the detection rate as shown in FIG. 30a, detection latency as shown in FIG. 30b, and false detection as shown in FIG. 30c, each with a 60 second moving window. The results in FIG. 30a and FIG. 30b are based on randomly injected RPM anomalies by randomly fabricating v(t) (FIG. 30a) and by randomly shifting v(t) (FIG. 30b), each with 100 tests. As shown in FIG. 30a, B-Diag achieves an overall averaged detection rate of 99% and 97% against the anomalies injected according to each method of injecting errors archives 100% detection rate for many of these 64 traces. The minimum detection rate of these traces with is 80% and 75%. FIG. 30(b) shows that B-Diag detects the anomalies with an averaged latency of less than 31 seconds and 68 seconds, for the two anomaly models respectively. The overall average detection latency across all these 64 traces is 8 seconds and 19 seconds for the two anomaly models respectively. Some embodiments of B-Diag's false detection of anomalies were evaluated. Specifically, B-Diag was applied to the genuine RPM traces without injecting anomalies, and checked if any false detection of RPM anomalies were triggered.

FIG. 30c shows B-Diag falsely detects RPM anomalies in only 4 of the 64 traces. Moreover, B-Diag only falsely detects the anomalies in {1,1,2,2} of the 60 s moving windows in the 4 traces with false detection, which last about {30, 26, 25, 25} minutes, respectively.

Figure 31:
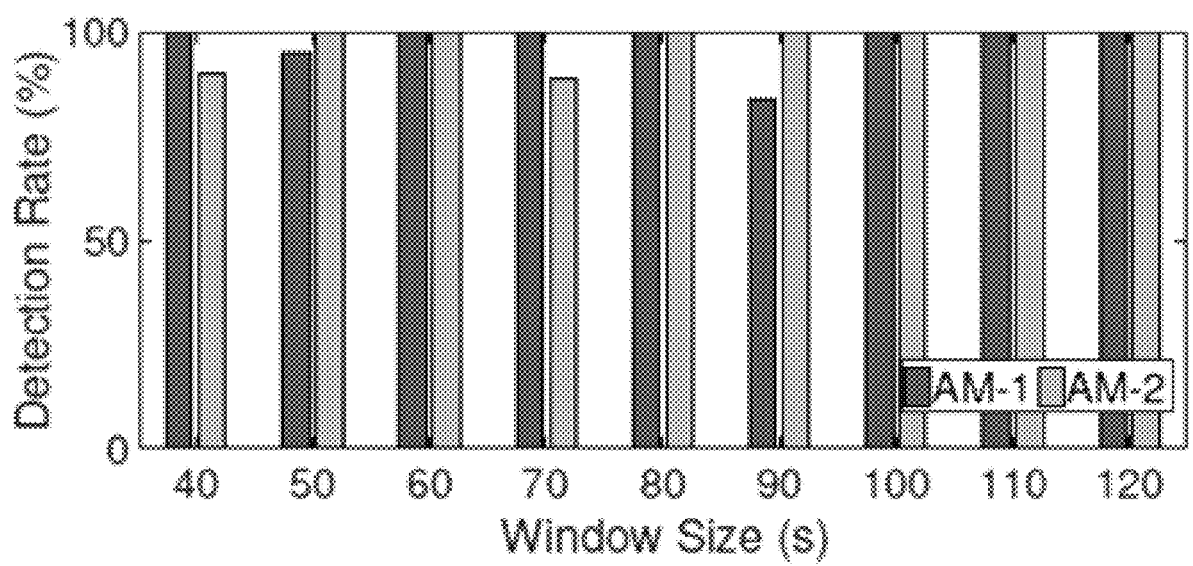
FIG. 31 is a plot illustrating the detection rate of B-Diag versus the time window size according to some embodiments of the present technology.
Figure 32:
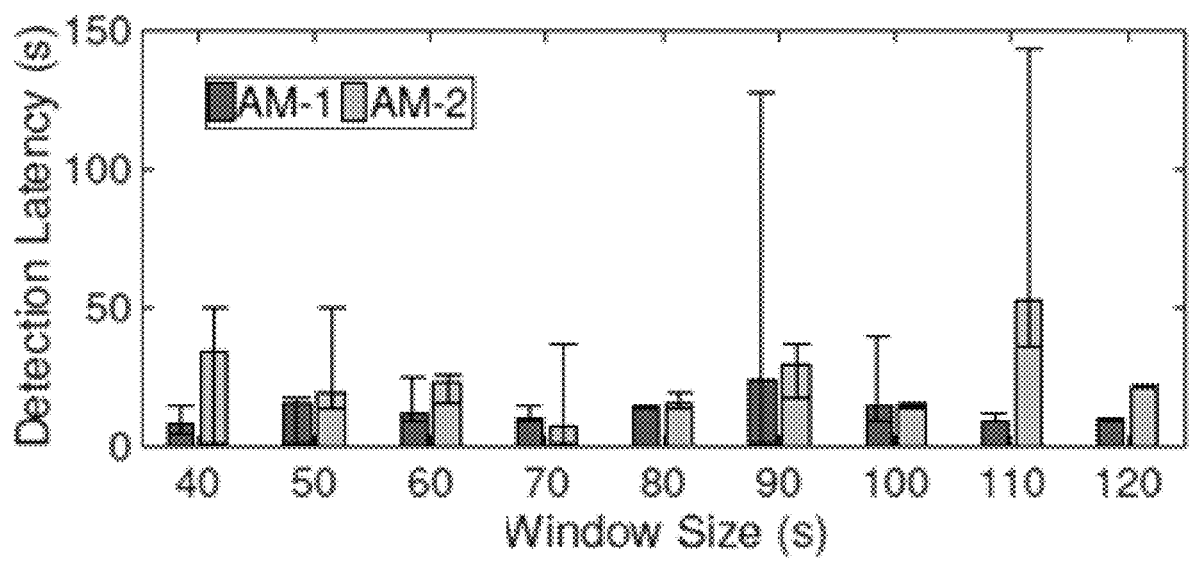
FIG. 32 is a plot illustrating the latency rate of B-Diag versus the time window size according to some embodiments of the present technology.

Next, the impact of the size of B-Diag's moving window is evaluated on its performance in anomaly detection, based on the RPM traces shown in FIG. 6. FIG. 31 and FIG. 32 summarize B-Diag's detection rate and latency of injected anomalies with the window size varying from 40 seconds to 120 seconds, showing an over 84% and 89% detection rate for all the explored cases and an average latency of 13 seconds and 24 seconds, for both anomaly injection methods respectively. No clear dependency between B-Diag's detection rate against anomalies and the window size is observed from FIG. 31. On the other hand, FIG. 32 shows a larger moving window tends to increase the latency of B-Diag's anomaly detection, which is expected as a larger window requires more samples of abnormal RPM readings to conclude the detection of anomalies, thus requiring a longer time.

Figure 33:
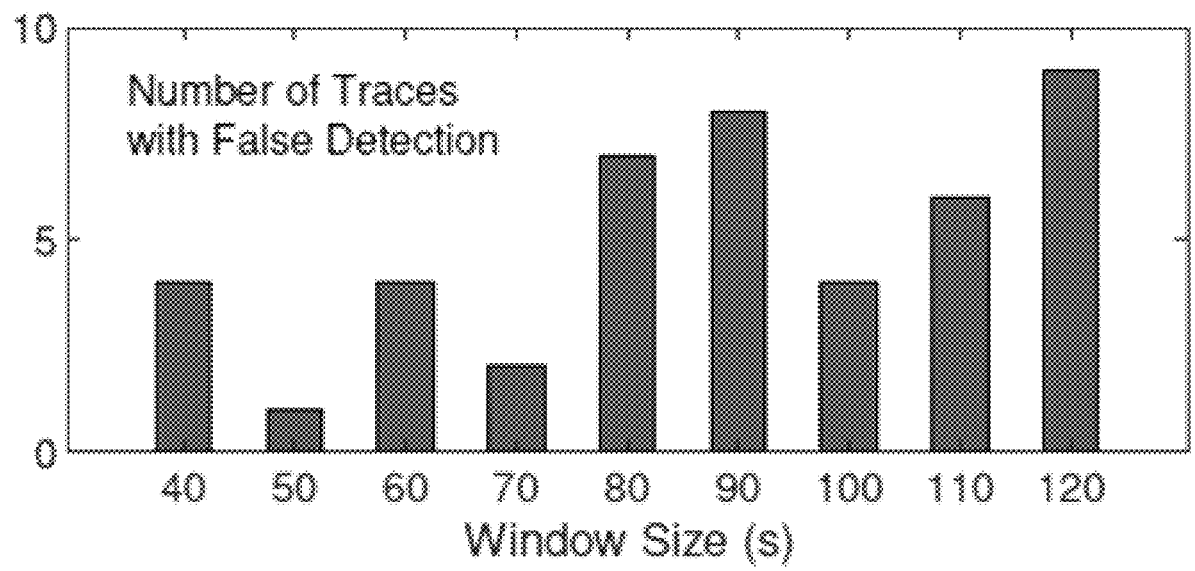
FIG. 33 is a plot illustrating the false detection rate of B-Diag versus the time window size according to some embodiments of the present technology.

FIG. 33 summarizes the false detection of anomalies when applying B-Diag to each of these genuine 64 traces (and thus without anomalies) with varying window size. The number of traces in which B-Diag falsely observes anomalies increases as the window becomes larger, varying from 1-9 with window size between 40 seconds and 120 seconds. Also note that even for traces with falsely observed anomalies, only a limited number of time windows therein detect such anomalies, with a maximum of 4 windows in all the cases in FIG. 33, and thus accounting for only a limited period when compared to the total driving duration of about 31 hours (as summarized in FIG. 4(e)).

Figure 34:
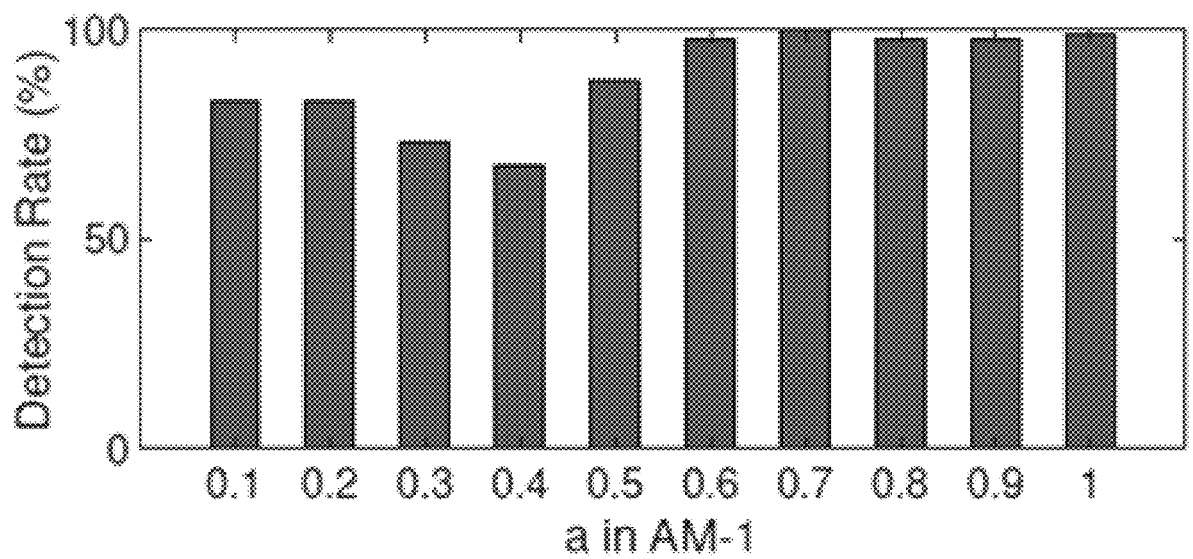
FIG. 34 is a plot illustrating the detection rate of B-Diag versus a mode of error injection according to one or more embodiments of the present technology.
Figure 35:
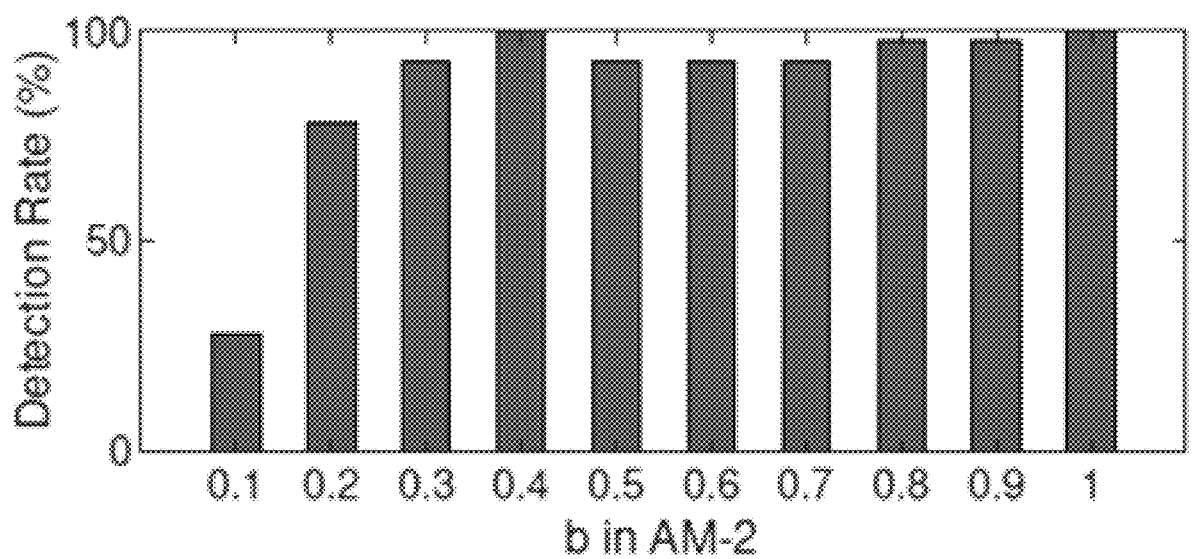
FIG. 35 is a plot illustrating the detection rate of B-Diag versus a mode of error injection according to one or more embodiments of the present technology.

FIG. 34 and FIG. 35 summarize B-Diag's detection rates of injected anomalies based on the RPM traces in FIG. 6, with varying a in the first anomaly injection equation and b in the second anomaly injection equation. The results are averaged over 100 tests for each setting. B-Diag detects the anomalies fabricated with the first anomaly injection equation with over 68% detection rates with a between 0.1 and 1 (see FIG. 34). The relatively low detection rate of 68% with a=0.4 is because in this case, the abnormal RPMs deviate little from their genuine levels. Specifically, with the RPM trace shown in FIG. 6, a=0.4 leads to abnormal RPMs within [573, 2069] according to the first anomaly injection equation which are close to their true values (as observed in FIG. 6). Also note that other things being equal, a smaller deviation of RMP readings from the genuine levels will cause less safety/reliability risks, when compared to those that change the RPMs dramatically. FIG. 35 shows B-Diag accurately detects the anomalies when the model parameter b in the second anomaly injection equation is not too small with over 93% detection rates when b=0.3. The low detection rate with b=0.1 is because, again, a small b in the second anomaly injection equation causes little deviation of abnormal RPM readings from their true levels.

Figure 37A:
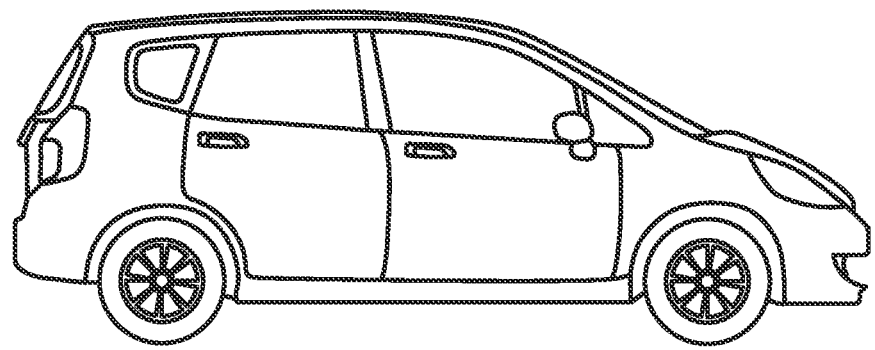
FIGS. 37a-37c are photographs of a 2008 Honda Fit®, a 2018 Volvo XC60®, and a 2017 Volkswagen Passat® used for prototype testing.
Figure 37B:
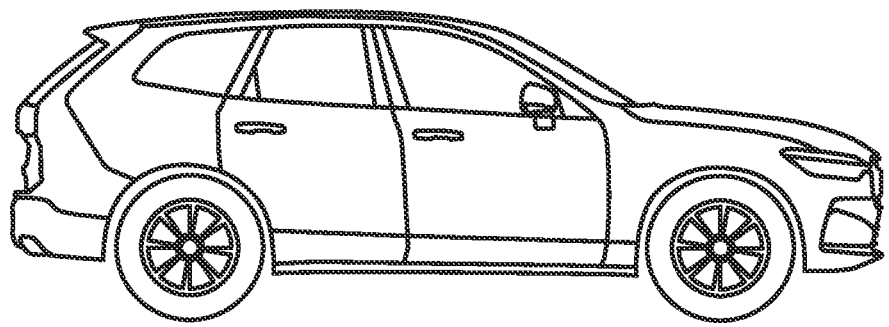
Figure 37C:
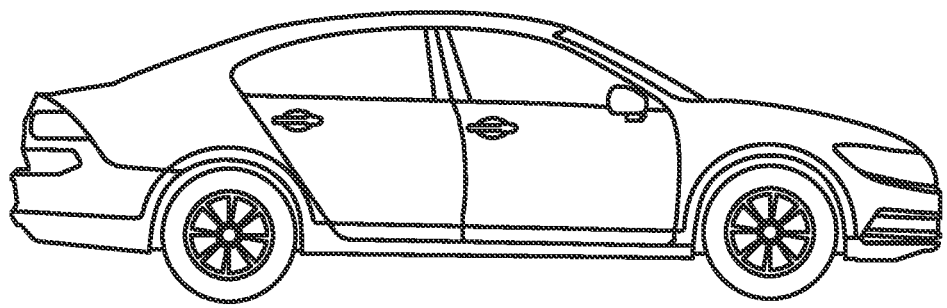

To further validate B-Diag's effectiveness, B-Daig was evaluated with different vehicles. In some embodiments B-Diag was validated based on the driving traces collected with a 2008 Honda Fit®, a 2018 Volvo XC60®, and a 2017 Volkswagen Passat® (see FIGS. 37a-37c), each with its respective owner/driver. Table 2 summarizes the details of these traces. Different from the Crosstrek traces where the battery voltage is collected with embodiments of the prototype and in physical separation of the in-vehicle network, the control module voltage collected from the in-vehicle network via the OBD-II port was used as a close approximation of the battery voltage for these three vehicles, for the ease of data collection. The control module voltage represents the real-time voltage supplied to the vehicle's ECUs, i.e., the battery voltage minus any voltage drop in the wiring between the battery and ECUs, normally less than a few tenths of a volt.

Figure 36:
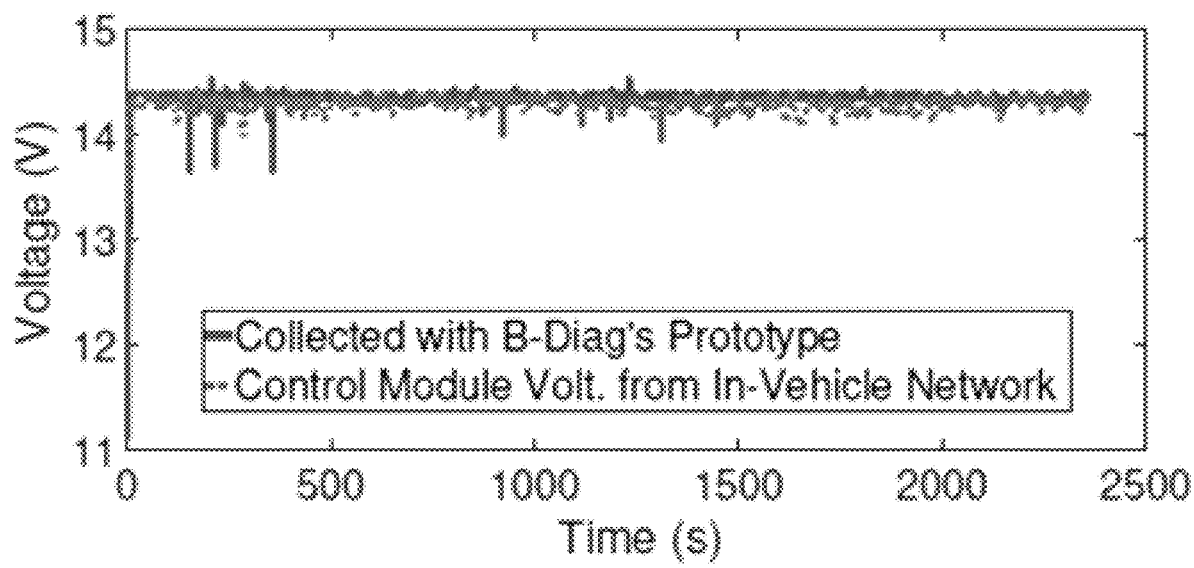
FIG. 36 is a plot illustrating that the difference between control module voltage and battery voltage according to some embodiments of the present technology.
Figure 38A:
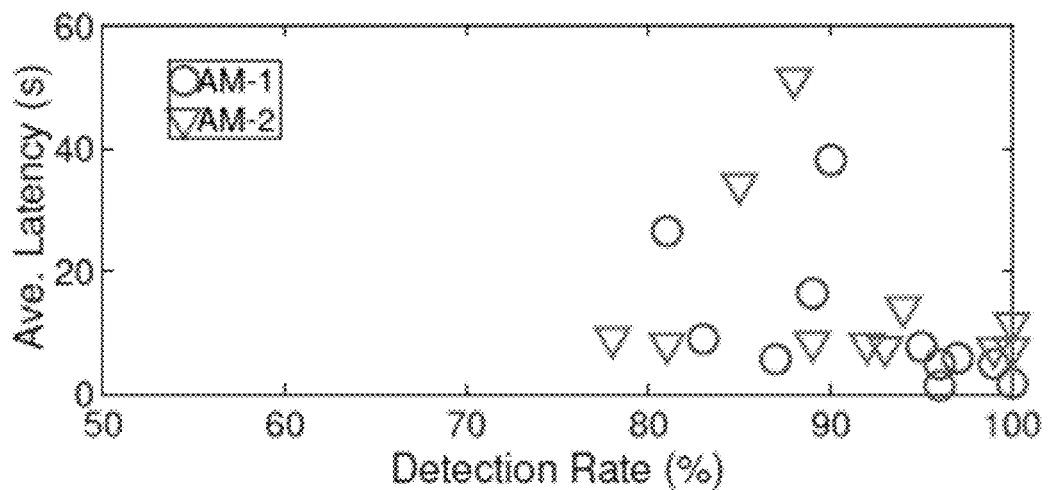
FIGS. 38a-38c are plot illustrating B-Diag function in a Honda Fit®, a Volvo XC60®, and a Volkswagen Passat® with error injection according to some embodiments of the present technology.
Figure 38B:
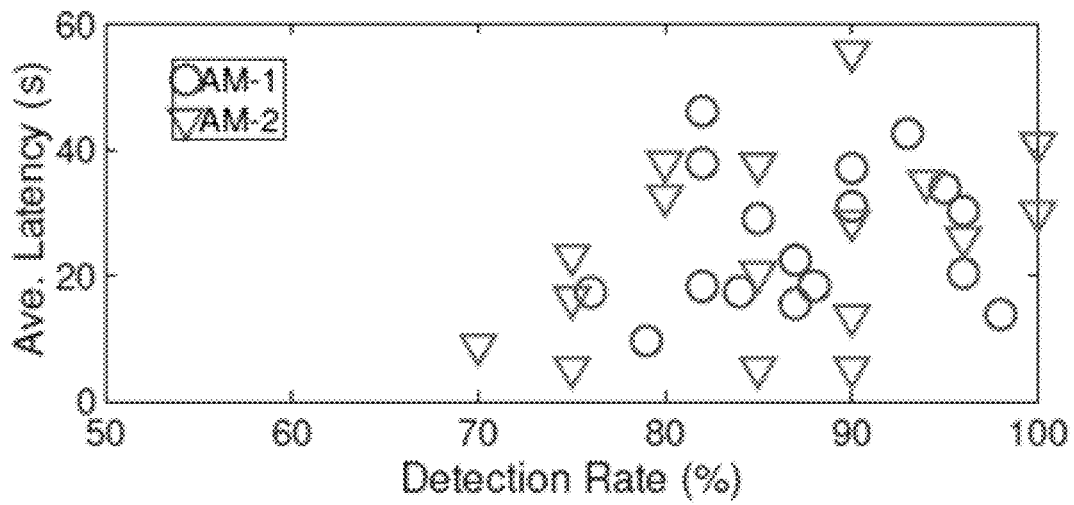
Figure 38C:
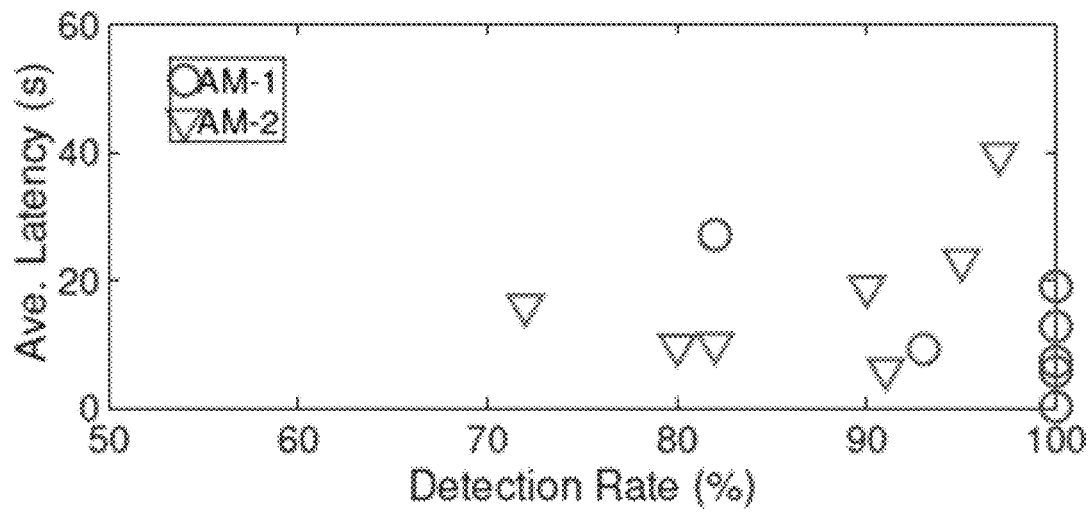

FIG. 36 compares the control module voltage with the corresponding battery voltage collected directly from the battery, corroborating their closeness. FIGS. 38a-38c plot B-Diag's detection rate and latency against the added anomalies, with a 60 second moving window and averaged over 100 runs. For the two anomaly models, B-Diag detects the anomalies with an averaged detection rate of 92% and 91% and a latency of 11 seconds and 15 seconds for the Honda Fit®, an averaged detection rate of 88% and 86% and a latency of 26 seconds and 28 seconds for the Volvo XC60®, and an averaged detection rate of 96% and 87% and a latency of 12 seconds and 18 seconds for the Volkswagen Passat®.

Figure 39:
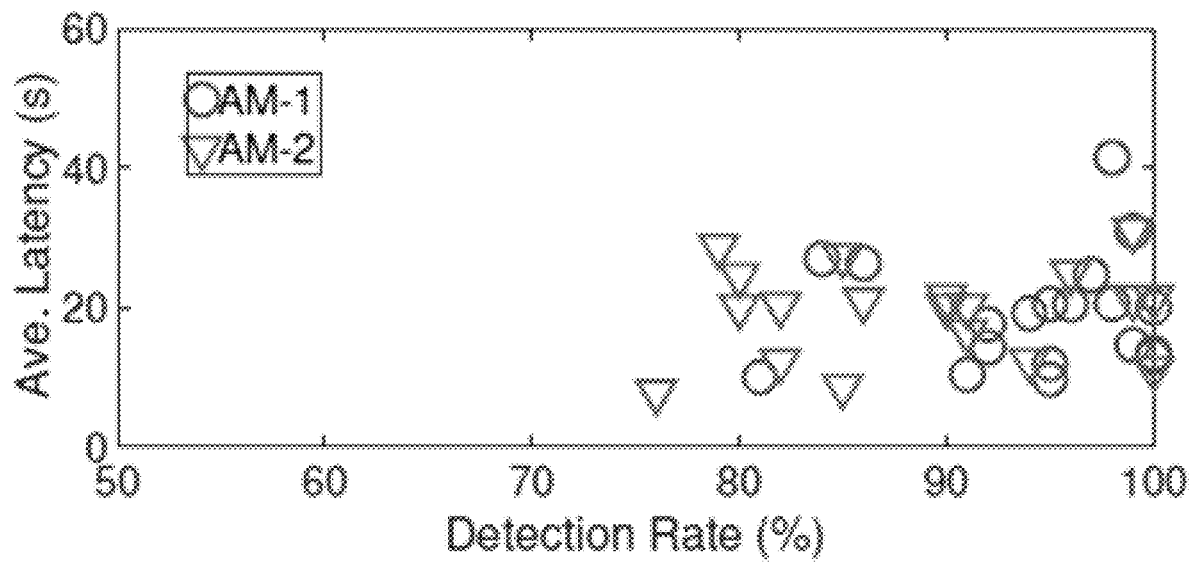
FIG. 39 is a plot using B-Diag to diagnostic plot according to some embodiments of the present technology.

Diag's feasibility was corroborated as a comprehensive diagnostics system for vehicles. Specifically, B-Diag was used to detect the anomalies at each of these vehicle systems in FIG. 22, injected according to the two anomaly models. FIG. 39 summarizes the detection results where all of these anomalies are detected with over 81% and 76% detection rate and a latency less than 42 seconds and 31 seconds, with an average of 94% and 89% and 19 seconds 20 seconds, respectively.

Last but not the least, various embodiments of B-Diag's generality were further verified in diagnosing the vehicle information listed in Table 1 which are originally identified with the Subaru Crosstrek®, with the Honda Fit®, the Volvo XC60®, and the Volkswagen Passat®. The strong correlations of these vehicle information with the battery voltage are observed in all these three vehicles, thus validating B-Diag's generality. This also demonstrates the advantage of B-Diag's cyber-physical approach in vehicle diagnostics: the physical dependencies among a vehicle's individual modules are (likely) general for different vehicles, making the correlations among the corresponding vehicle information universal.

B-Diag constructs the norm models with a decision tree defined by 10 features. Other embodiments improve such model construction by reducing the number of features and by exploiting the overlapped time windows, thus reducing the complexity and improving the online diagnostics of vehicles. Also, B-Diag assumes the availability of normal traces to construct the norm model. In other embodiments, B-Diag's may perform vehicle diagnostics when the normal traces are not available.

B-Diag detects the anomalies based on the $\tau_i$s (as previously defined) for each time window. In an alternative embodiment, B-Diag may conclude the detection of anomalies only when multiple $\tau_i$s have been observed in several consecutive time windows, trading off between the anomaly detection's false positive and false negative. Latency of anomaly detection may also be considered, which is desirable to be as small as possible. The window size should be a promising control knob to reduce the latency. B-Diag verifies the detected anomalies by checking the norm models defining the interplays among vehicle information and confirms the detected anomalies if any of these checks fail. Other methods for anomaly confirmation include weighting the checking results of individual norm models.

In other embodiments, after detecting and verifying the anomalies, B-Diag will identify the corresponding causes, such as which modules or ECUs of the vehicle fail. Such a fault identification is required to provide a swift repair/forensic, otherwise the vehicle remains unreliable no matter how accurate the anomalies are detected. B-Diag's fault identification may be based on the correlation graph defined in FIG. 23, or by examining the connectivity among vertexes (i.e., vehicle systems) with detected anomalies.

B-Diag's ability in individually diagnose other vehicle information beyond engine RPM is not limited and may be extrapolated to other vehicles, devices, or machine. B-Diag presents methods and systems that are an integrated solution that guards all vehicle information in real-time. Additionally, when expanded to other systems, B-Diag becomes a comprehensive solution for vehicle diagnosis, especially in view of the possibility of cascaded anomalies in vehicles, such as when anomalies in one vehicle system causes anomalies in other information.

Exemplary Computer System Overview

Figure 40:
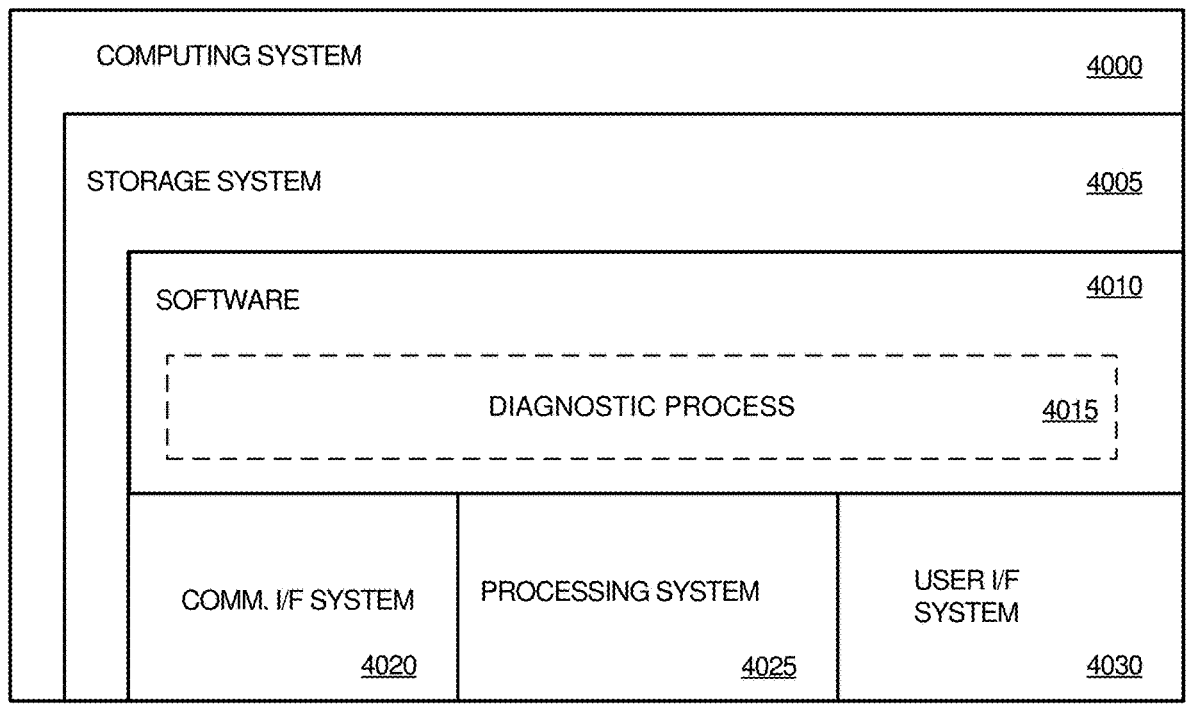
FIG. 40 is a block diagram representing an idealized computing system which incorporates one or more embodiment of the present technology.

FIG. 40 illustrates computing system 4000 that is representative of any system or collection of systems in which the various processes, programs, services, and scenarios disclosed herein may be implemented with respect to vehicle or machine diagnostics.

Computing system 4000 may be implemented as a single apparatus, system, or device or may be implemented in a distributed manner as multiple apparatuses, systems, or devices. Computing system 4000 includes, but is not limited to, processing system 4025, storage system 4005, software 4010, communication interface system 4020, and user interface system 4030 (optional). Processing system 4025 is operatively coupled with storage system 4005, communication interface system 4020, and user interface system 4030.

Processing system 4025 loads and executes software 4010 from storage system 4005. Software 4010 includes and implements diagnostic process 4015, which is representative of the diagnostic processes discussed with respect to the preceding Figures. When executed by processing system 4025, software 4010 directs processing system 4025 to operate as described herein for at least the various processes, operational scenarios, and sequences discussed in the foregoing implementations. Computing system 4000 may optionally include additional devices, features, or functionality not discussed here for purposes of brevity.

Referring still to FIG. 40, processing system 4025 may comprise a micro-processor and other circuitry that retrieves and executes software 4010 from storage system 4005. Processing system 4025 may be implemented within a single processing device but may also be distributed across multiple processing devices or sub-systems that cooperate in executing program instructions. Examples of processing system 4025 include general purpose central processing units, graphical processing units, application specific processors, and logic devices, as well as any other type of processing device, combinations, or variations thereof.

Storage system 4005 may comprise any computer readable storage media that is readable by processing system 4025 and capable of storing software 4010. Storage system 4005 may include volatile and nonvolatile, removable and non-removable media implemented in any method or technology for storage of information, such as computer readable instructions, data structures, program modules, or other data. Examples of storage media include random access memory, read only memory, magnetic disks, optical disks, optical media, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 4005 may also include computer readable communication media over which at least some of software 4010 may be communicated internally or externally. Storage system 4005 may be implemented as a single storage device but may also be implemented across multiple storage devices or sub-systems co-located or distributed relative to each other. Storage system 4005 may comprise additional elements, such as a controller, capable of communicating with processing system 4025 or possibly other systems.

Software 4010 (e.g., diagnostic process 4015) may be implemented in program instructions and among other functions may, when executed by processing system 4025, direct processing system 4025 to operate as described with respect to the various operational scenarios, sequences, and processes illustrated herein. For example, software 4010 may include program instructions for implementing a diagnostic process implemented by B-Diag or a related device as described herein.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 4010 may include additional processes, programs, or components, such as operating system software, virtualization software, or other application software. Software 4010 may also comprise firmware or some other form of machine-readable processing instructions executable by processing system 4025.

In general, software 4010 may, when loaded into processing system 4025 and executed, transform a suitable apparatus, system, or device (of which computing system 4000 is representative) overall from a general-purpose computing system into a special-purpose computing system customized to optimize secure traffic as described herein. Indeed, encoding software 4010 on storage system 4005 may transform the physical structure of storage system 4005. The specific transformation of the physical structure may depend on various factors in different implementations of this description. Examples of such factors may include, but are not limited to, the technology used to implement the storage media of storage system 4005 and whether the computer-storage media are characterized as primary or secondary storage, as well as other factors.

For example, if the computer readable storage media are implemented as semiconductor-based memory, software 4010 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Communication interface system 4020 may include communication connections and devices that allow for communication with other computing systems (not shown) over communication networks (not shown). Examples of connections and devices that together allow for inter-system communication may include network interface cards, antennas, power amplifiers, RF circuitry, transceivers, and other communication circuitry. The connections and devices may communicate over communication media to exchange communications with other computing systems or networks of systems, such as metal, glass, air, or any other suitable communication media. The aforementioned media, connections, and devices are well known and need not be discussed at length here.

Communication between computing system 4000 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses and backplanes, or any other type of network, combination of network, or variation thereof. The aforementioned communication networks and protocols are well known and need not be discussed at length here.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A method to facilitate vehicle diagnostics, the method comprising:
constructing a predictive norm model configured to determine correlations between a battery of a vehicle and one or more components of the vehicle, wherein the correlations comprise a first correlation between voltages of the battery and output values of the one or more other components over a time period and a second correlation between maximum values of the voltages and maximum values of the output values over the time period;
measuring real-time voltages of the battery and real-time output values of the one or more components;
supplying the real-time voltages to the predictive norm models;
determining, via the predictive norm model, predicted output values associated with the one or more components of the vehicle based on applying the correlations to the real-time voltages;
determining whether a state of the one or more components of the vehicle is anomalous by cross-validating the real-time output values with the predicted output values; and
generating an alert if the state of the one or more components is anomalous.

2. The method of claim 1, wherein constructing the predictive norm model comprises training the predictive norm model with at least a first feature vector of the voltages and the maximum values of the voltages and a second feature vector of the output values and the maximum values of the output values.

3. The method of claim 2, wherein determining the correlations comprises producing a correlation feature vector based on values of the first feature vector and corresponding values of the second feature vector over the time period.

4. The method of claim 3, wherein applying the correlations comprises applying the correlation feature vector to the real-time voltages.

5. The method of claim 1, wherein cross-validating further comprises determining that the state of the one or more components of the vehicle is anomalous when the real-time output values differ from the predicted output values of the predictive norm model.

6. The method of claim 5, further comprising verifying that the state of the one or more components of the vehicle is anomalous by comparing the real-time output values with one or more other known operating parameters.

7. The method of claim 1, wherein cross-validating further comprises determining that the state of the one or more components of the vehicle is normal when the real-time output values align with the predicted output values of the predictive norm model.

8. A system to facilitate vehicle diagnostics, the system comprising:
a processor;
a battery monitor to collect voltage of a battery in real-time and to generate a corresponding voltage signal;
a converter to transform the voltage signal into digital signal;
a communications module to collect vehicle information from an in-vehicle network of a vehicle; and
a machine learning engine, under the control of the processor, to:
ingest the digital signal as an input to a predictive norm model of the machine learning engine, wherein the predictive norm model is configured to determine correlations between the battery and other components of the vehicle, and wherein the correlations comprise a first correlation between the voltage of the battery and output values of the other components over a time period and a second correlation between maximum values of the voltage and maximum values of the output values over the time period;

generate, via the predictive norm model, predicted vehicle information based on applying the correlations to the digital signal; and determine an anomalous state within the other components of the vehicle based on a comparison between the predicted vehicle information and the vehicle information collected by the communications module.

9. The system of claim 8, wherein the predictive norm model is trained with at least a first feature vector of the voltage and the maximum values of the voltage and a second feature vector of the output values and the maximum values of the output values.

10. The system of claim 9, wherein determining the correlations comprises producing a correlation feature vector based on values of the first feature vector and corresponding values of the second feature vector over the time period.

11. The system of claim 10, wherein applying the correlations comprises applying the correlation feature vector to the digital signal.

12. The system of claim 8, wherein the machine learning engine determines that the state of the other components of the vehicle are anomalous when the predicted vehicle information differs from the vehicle information.

13. The system of claim 12, wherein, upon determining the state of the other components of the vehicle are anomalous, the machine learning engine validates that the state of the other components of the vehicle are anomalous by comparing the vehicle information to other known correlations.

14. The system of claim 8, wherein the predicted vehicle information is indicative of the output values of the other components based on the digital signal.

15. The system of claim 8, wherein the communications module, upon verification that an anomaly has occurred, notifies a vehicle operator that an anomaly has occurred.

16. A system to facilitate vehicle diagnostics, the system comprising:

a memory having stored thereon predictive correlations between a battery and one or more components within a machine, wherein the predictive correlations comprise a first correlation between voltage of the battery and output values of the components over a time period and a second correlation between maximum values of the voltage and maximum values of the output values over the time period;

a diagnostic module configured to:

ingest real-time voltage signals of the machine and generate one or more predicted output values of the components based on applying the predictive correlations to the real-time voltage signals; and determine an operating condition of the machine by cross-validating the one or more predicted output values with real-time output values of the components, wherein the operating condition includes an anomalous state and a normal state, wherein the normal state is indicative of a convergence between the one or more predicted output values and the operating condition of the machine, and wherein the anomalous state is indicative of a divergence between the one or more predicted output values and the operating condition of the machine; and a communication system to generate an alert if the state of the operating condition of the machine is anomalous.

17. The system of claim 16, wherein to generate one or more predicted output values, the diagnostic module utilizes a predictive norm model.

18. The system of claim 16, wherein the diagnostic module determines that the anomalous state occurred in the operating condition of the machine when at least one of the predicted output values differs from a corresponding real-time output value of the components.

19. The system of claim 18, wherein the diagnostic module, prior to the generation of the alert, validates that the anomalous state has occurred in by comparing the operating condition of the machine to other known correlations.

20. The system of claim 16, wherein the diagnostic module determines that the normal state occurred in the operating condition of the machine when at least one of the predicted output values aligns with a corresponding real-time output value of the components.

\* \* \* \* \*